United States Patent
Ishihara et al.

(10) Patent No.: US 9,370,101 B2
(45) Date of Patent: Jun. 14, 2016

(54) METHOD FOR PLUG-IN BOARD REPLACEMENT AND METHOD FOR MANUFACTURING MULTI-PIECE BOARD

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 321 days.

(21) Appl. No.: 14/014,654

(22) Filed: Aug. 30, 2013

(65) Prior Publication Data

US 2014/0063770 A1 Mar. 6, 2014

Related U.S. Application Data

(60) Provisional application No. 61/694,973, filed on Aug. 30, 2012.

(51) Int. Cl.
| | |
|---|---|
| H05K 3/36 | (2006.01) |
| H05K 1/14 | (2006.01) |
| H05K 3/00 | (2006.01) |
| H05K 3/22 | (2006.01) |

(52) U.S. Cl.
CPC .............. H05K 1/142 (2013.01); H05K 3/0032 (2013.01); H05K 3/0097 (2013.01); H05K 3/36 (2013.01); H05K 3/225 (2013.01); *H05K 2203/0169* (2013.01); *H05K 2203/0554* (2013.01); *H05K 2203/107* (2013.01); *H05K 2203/1572* (2013.01); *Y10T 29/49126* (2015.01)

(58) Field of Classification Search
CPC .. H05K 3/0052; H05K 3/36; Y10T 156/1052; Y10T 156/12
USPC .......... 29/830, 402.01, 412, 464, 846; 439/5, 439/32, 65, 885
See application file for complete search history.

(56) References Cited

U.S. PATENT DOCUMENTS

| | | | | |
|---|---|---|---|---|
| 8,572,839 | B2 * | 11/2013 | Hasegawa | ............ H05K 3/0052 29/412 |
| 9,095,069 | B2 * | 7/2015 | Stefanoff | ............... H05K 1/142 |
| 2008/0149368 | A1 | 6/2008 | Young | |
| 2012/0047728 | A1 | 3/2012 | Hasegawa | |

FOREIGN PATENT DOCUMENTS

| | | |
|---|---|---|
| JP | 10-022630 A | 1/1998 |
| JP | 2002-43702 A | 2/2002 |

(Continued)

*Primary Examiner* — Thiem Phan
(74) *Attorney, Agent, or Firm* — Oblon, McClelland, Maier & Neustadt, L.L.P.

(57) ABSTRACT

A plug-in board replacement method includes preparing a board having a piece board, forming first conductive pattern on first surface of the board, forming second conductive pattern on second surface on the opposite side such that the second pattern is on the opposite side of the first pattern, irradiating laser upon the first and second surfaces along the first and second patterns such that the piece is cut out from the board, and fitting the piece into another board. The irradiating includes irradiating laser upon the first surface along the first pattern such that laser is irradiated along the border between edge portion of the first pattern and the first surface and laser upon the second surface along the second pattern such that laser is irradiated along the border between edge portion of the second pattern and the second surface such that the piece is cut out through the board.

14 Claims, 24 Drawing Sheets

(56) References Cited

FOREIGN PATENT DOCUMENTS

| | | |
|---|---|---|
| JP | 2005-216969 A | 8/2005 |
| JP | 2011-023657 | 2/2011 |
| JP | 2012-84746 A | 4/2012 |
| KR | 10-2011-0036856 A | 4/2011 |

* cited by examiner

METHOD FOR PLUG-IN BOARD REPLACEMENT AND METHOD FOR MANUFACTURING MULTI-PIECE BOARD

CROSS-REFERENCE TO RELATED APPLICATIONS

The present application is based upon and claims the benefit of priority from U.S. Application No. 61/694,973, filed Aug. 30, 2012, the entire contents of which are incorporated herein by reference.

BACKGROUND OF THE INVENTION

1. Field of the Invention

The present invention relates to a method for a plug-in board replacement, a method for manufacturing a multi-piece board, and a multi-piece board.

2. Description of Background Art

In manufacturing steps of a wiring board, treatments such as etching and exposure to light are conducted on a unit of integrated piece boards. For example, Japanese Laid-Open Patent Publication No. 2011-23657 describes a multi-piece board made up of a frame with space for accommodating piece boards and of multiple piece boards that are cut out from a different frame. Such piece boards of a multi-piece board are good piece boards which have cleared predetermined quality inspection. The entire contents of this publication are incorporated herein by reference.

SUMMARY OF THE INVENTION

According to one aspect of the present invention, a plug-in board replacement method includes preparing a board having a piece board, forming a first conductive pattern on a first surface of the board, forming a second conductive pattern on a second surface on the opposite side of the board with respect to the first surface such that the second conductive pattern is positioned on the opposite side of the board with respect to the first conductive pattern of the board, irradiating laser upon the first surface and second surface of the board along the first conductive pattern and the second conductive pattern such that the piece board is cut out from the board, and fitting the piece board cut out from the board into another board. The irradiating of laser includes a first laser irradiation including irradiating laser upon the first surface of the board along the first conductive pattern such that the laser is irradiated along the border between an edge portion of the first conductive pattern and the first surface of the board and a second laser irradiation including irradiating laser upon the second surface of the board along the second conductive pattern such that the laser is irradiated along the border between an edge portion of the second conductive pattern and the second surface of the board such that the piece board is cut out through the board.

According to another aspect of the present invention, a method for manufacturing a multi-piece board includes preparing a board having a piece wiring board, forming a first conductive pattern on a first surface of the board, forming a second conductive pattern on a second surface on the opposite side of the board with respect to the first surface such that the second conductive pattern is positioned on the opposite side of the board with respect to the first conductive pattern of the board, irradiating laser upon the first surface and second surface of the board along the first conductive pattern and the second conductive pattern such that the piece wiring board is cut out from the board, and fitting the piece wiring board cut out from the board into a frame. The irradiating of laser includes a first laser irradiation including irradiating laser upon the first surface of the board along the first conductive pattern such that the laser is irradiated along the border between an edge portion of the first conductive pattern and the first surface of the board and a second laser irradiation including irradiating laser upon the second surface of the board along the second conductive pattern such that the laser is irradiated along the border between an edge portion of the second conductive pattern and the second surface of the board such that the piece wiring board is cut out through the board.

According to yet another aspect of the present invention, a multi-piece board includes wiring boards, and a frame connected to each of the wiring boards. The wiring boards includes a first wiring board having a first plug-in portion, the frame has a second plug-in portion formed to be fitted to the first plug-in portion of the first wiring board, and the first plug-in portion of the first wiring board has a first surface, a second surface on the opposite side with respect to the first surface, a first conductive pattern on the first surface and a second conductive pattern on the second surface on the opposite side with respect to the first conductive pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
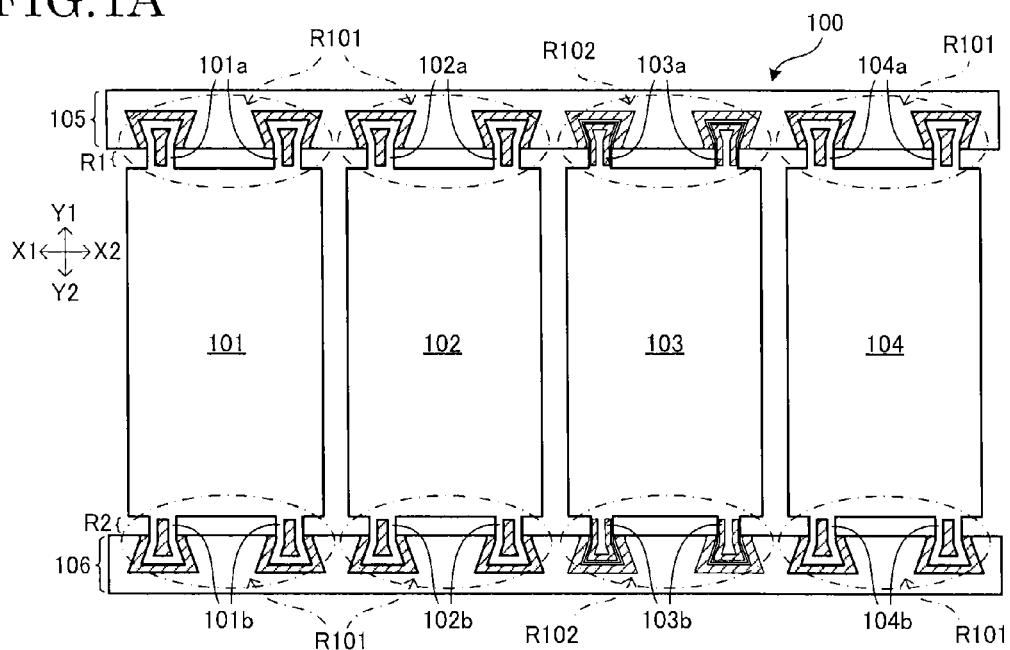
FIG. 1A is a plan view schematically showing one main surface of a multi-piece board according to an embodiment of the present invention.

The embodiments will now be described with reference to the accompanying drawings, wherein like reference numerals designate corresponding or identical elements throughout the various drawings.

Arrows (Z1, Z2) in the drawings each indicate a lamination direction of a board (or a thickness direction of the board) corresponding to normal lines to main surfaces (upper and lower surfaces) of the board. On the other hand, arrows (X1, X2) and (Y1, Y2) each indicate a direction perpendicular to a lamination direction (or a direction to a side of each layer). Main surfaces of a board are on the X-Y plane. Side surfaces of a board are on the X-Z plane or Y-Z plane. Edge surfaces of a conductive pattern correspond to side surfaces of the conductive pattern.

Figure 1B:
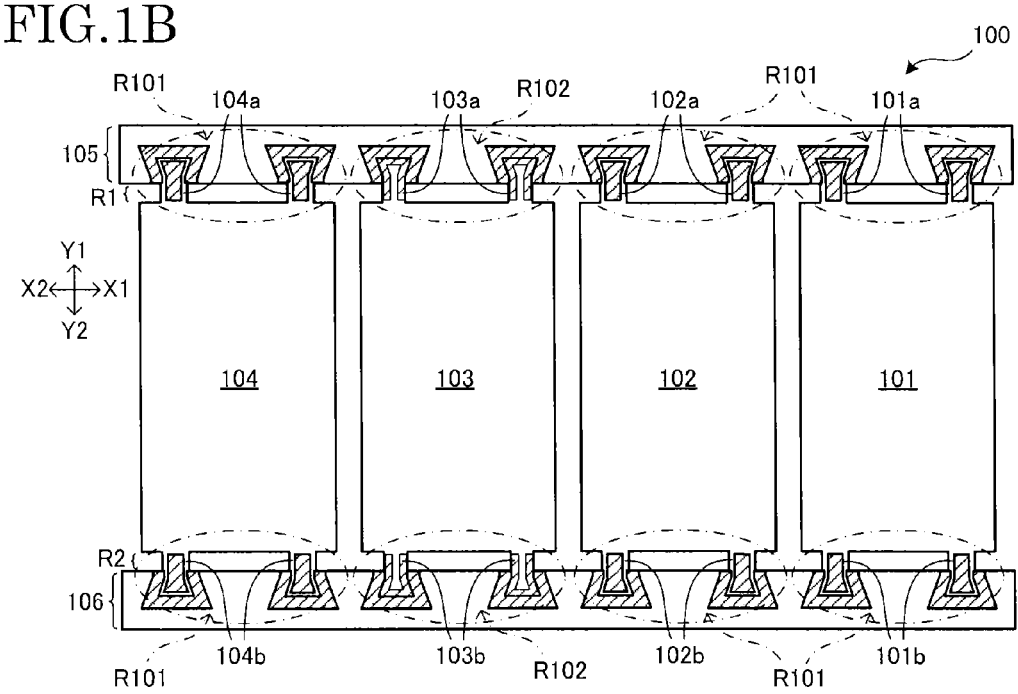
FIG. 1B is a plan view schematically showing the other main surface of the multi-piece board according to the embodiment of the present invention.

FIG. 1A is a plan view schematically showing one main surface of multi-piece board 100 according to the present embodiment. FIG. 1B is a plan view schematically showing the other main surface of multi-piece board 100 according to the present embodiment.

Multi-piece board 100 of the present embodiment has piece boards (101~104), frames (105, 106), bridges (101a~104a) to partially connect each piece board to frame 105, and bridges (101b~104b) to partially connect each piece board to frame 106 as shown in FIGS. 1A and 1B. The thickness of multi-piece board 100 is made uniform throughout, for example. Namely, the thickness of frames (105, 106) and thickness of piece boards (101~104) are substantially the same as each other. The number of piece boards per one multi-piece board and the number of bridges per one piece board or per one frame are determined freely. Also, electronic components may be mounted on surfaces of piece boards or built into them.

Frame 105 is positioned on one side of piece boards (101~104) (the Y1-side, for example) with space (R1), and frame 106 is positioned on the other side of piece boards (101~104) (the Y2-side, for example) with space (R2). However, piece boards (101~104) are each connected to frame 105 by bridges (101a~104a) while being connected to frame 106 by bridges (101b~104b). Bridges on one side (bridges (101a~104a)) and bridges on the other side (bridges (101b~104b)) are provided two each per one piece board, for example. However, that is not the only option, and the number of bridges is selected freely. Also, the number of bridges on one side may be different from the number of bridges on the other side.

Piece boards (101~104) are each a rigid wiring board in a rectangular shape, for example. Piece boards (101~104) each include circuits for electronic devices, for example. Piece boards (101~104) have the same structure as each other, for example. Namely, piece boards (101~104) are interchangeable in the present embodiment. However, that is not the only option, and piece boards (101~104) may have different structures from each other.

Conductors in each piece board (wiring layer, via conductors, through-hole conductors or the like) are made of copper, for example. Insulation layers in each piece board are made by impregnating base material such as glass cloth, nonwoven aramid fabric or paper with uncured epoxy resin, polyimide resin, phenol resin or the like. However, the material of each piece board is not limited specifically. Basically, the structure (such as the number of layers) of each piece board is determined freely.

Frames (105, 106) are two long narrow bar-shaped portions sandwiching four piece boards (101~104). Frames (105, 106) are made of the same material as that of the insulation layers of piece boards (101~104), for example.

The shapes of piece boards and frames of multi-piece board 100 may be modified freely. For example, frames may be in a ring shape surrounding piece boards (elliptical or rectangular ring shape, for example), an L-shape, a T-shape, a Y-shape or an H-shape. Piece boards may be in a parallelogram shape, an elliptical shape, an L-shape, a T-shape, or a Y-shape. Piece boards are not limited to rigid wiring boards, and they may be flexible wiring boards or flex-rigid wiring boards.

Figure 2:
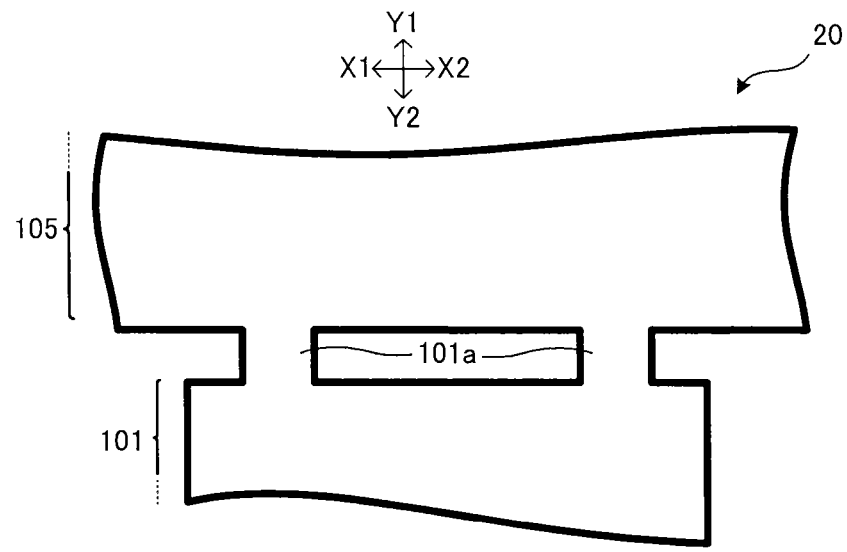
FIG. 2 is a view showing a first connection part of a piece board and a frame in the multi-piece board according to the embodiment of the present invention.

In the present embodiment, three piece boards (101, 102, 104) are integrated with frames (105, 106). In the present embodiment, as shown in FIG. 2, for example, at the connection part of piece board 101 and frame 105 (the part corresponding to region (R101) in FIGS. 1A and 1B), piece board 101, bridges (101a) and frame 105 are all made from a single board (second board 20, for example). Also, the connection part of piece board 101 and frame 106 has the same structure as the connection part of piece board 101 and frame 105 (see FIG. 2) in the present embodiment. Namely, piece board 101, bridges (101a, 101b) and frames (105, 106) are all made from a single board (second board 20, for example) in the present embodiment. In addition, connection parts of piece boards (102, 104) have the same structure as the connection part of piece board 101 (see FIG. 2) in the present embodiment. Namely, in multi-piece board 100 of the present embodiment (FIG. 1), piece boards (101, 102, 104), bridges (101a, 101b, 102a, 102b, 104a, 104b) and frames (105, 106) are all made from a single board (second board 20, for example).

Figure 3:
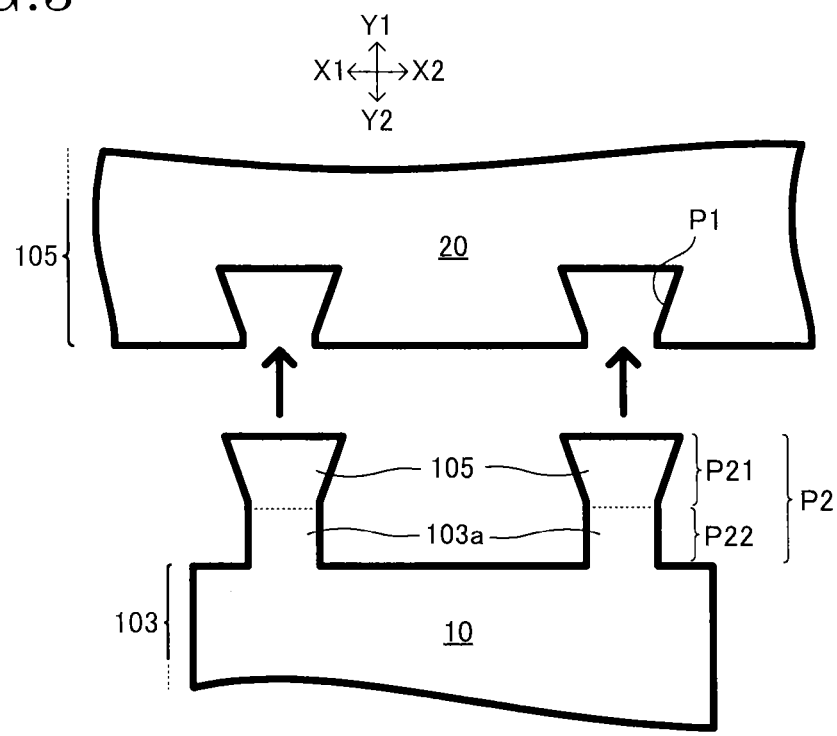
FIG. 3 is a view showing a second connection part of a piece board and a frame in the multi-piece board according to the embodiment of the present invention.

On the other hand, piece board 103 (first wiring board) is manufactured separately from frames (105, 106) and then is attached to frames (105, 106). In the present embodiment, piece board 103 has plug-in portion (P21) (first plug-in portion) and frame 105 has plug-in portion (P1) (second plug-in portion) to be fitted to plug-in portion (P21) at the connection part of piece board 103 and frame 105 (the part corresponding to region (R102) in FIGS. 1A and 1B), as shown in FIG. 3, for example. In the present embodiment, plug-in portion (P1) is a trapezoidal concave having a width increasing toward the inside. Plug-in portion (P21) is a trapezoidal convex having a width increasing toward the tip. Piece board 103 has convex portion (P2). Convex portion (P2) is made up of plug-in portion (P21) (tip portion) and bridge (P22) (base portion). Namely, piece board 103, plug-in portion (P21) and bridge (P22) are made from a single board (first board 10, for example), and plug-in portion (P1) is formed in another board (second board 20, for example) in the present embodiment. In multi-piece board 100 of the present embodiment (FIG. 1), plug-in portion (P21) of piece board 103 and plug-in portion (P1) of frame 105 are fitted together so that piece board 103 and frame 105 are connected to each other. Then, plug-in portion (P21) forms part of frame 105, and bridge (P22) forms bridge (103a). In the present embodiment, the connection part of piece board 103 and frame 106 has the same structure as the connection part of piece board 103 and frame 105 (see FIG. 3). In addition, the plug-in portions of a connection part are reinforced by an adhesive in the present embodiment (for details, see the later description of a manufacturing method).

Multi-piece board 100 of the present embodiment (FIG. 1) has conductive patterns in connection parts of piece boards and frames. However, different conductive patterns are formed in the connection part of piece board 103 made from first board 10 and in connection parts of piece boards (101, 102, 104) made from second board 20.

In the following, a method for manufacturing multi-piece board 100 is described according to the present embodiment. In the following description, conductive patterns in each connection part above are also described in detail.

Figure 4:
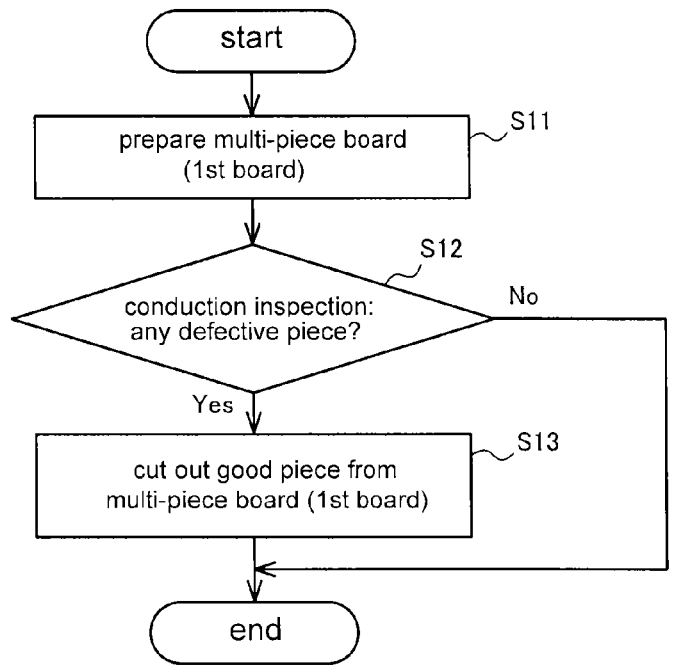
FIG. 4, in a method for manufacturing a multi-piece board (plug-in board replacement method) according to the embodiment of the present invention, is a flowchart showing a method for cutting out a good piece from a first board.

First, a good piece (first wiring board) is cut out from first board 10 (multi-piece board) according to the order shown in FIG. 4, for example.

Figure 5:
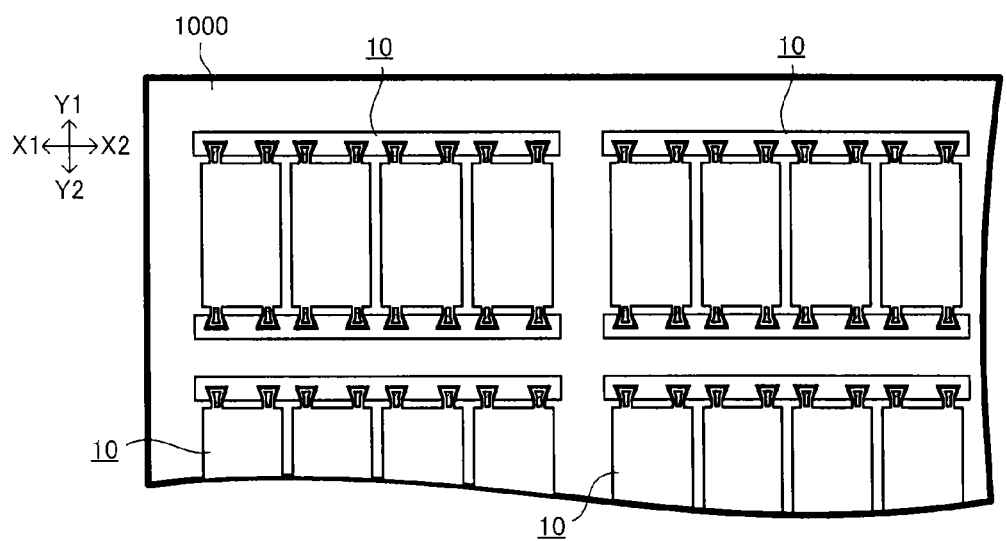
FIG. 5 is a view illustrating a step for preparing a first board in the method shown in FIG. 4.

In step (S11) of FIG. 4, first board 10 is prepared. First board 10 is a multi-piece board. In the present embodiment, multiple first boards 10 are manufactured in one manufacturing panel 1000 as shown in FIG. 5, for example. First boards 10 are each manufactured by widely used manufacturing methods of laminated wiring boards, such as a plating method, buildup processing using copper foil with resin or the like. Then, first boards 10 are each cut out from manufacturing panel 1000 by alignment router or the like to obtain an individual unit of first board 10.

Figure 6A:
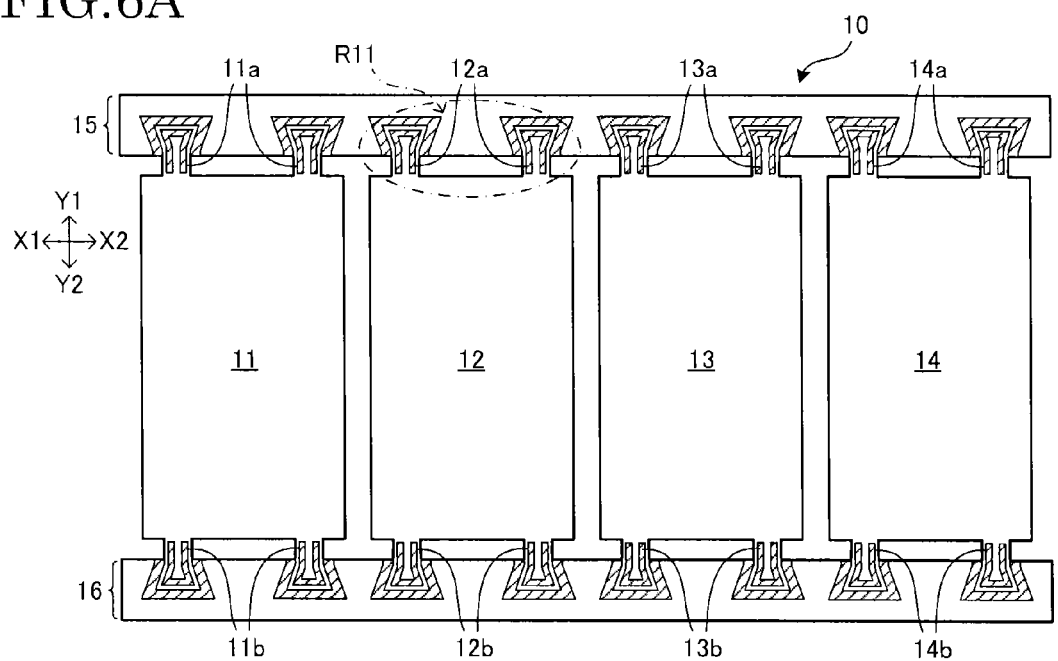
FIG. 6A is a plan view schematically showing one main surface of a first board prepared in the step in FIG. 5.

FIG. 6A is a plan view schematically showing one main surface of first board 10.

Figure 6B:
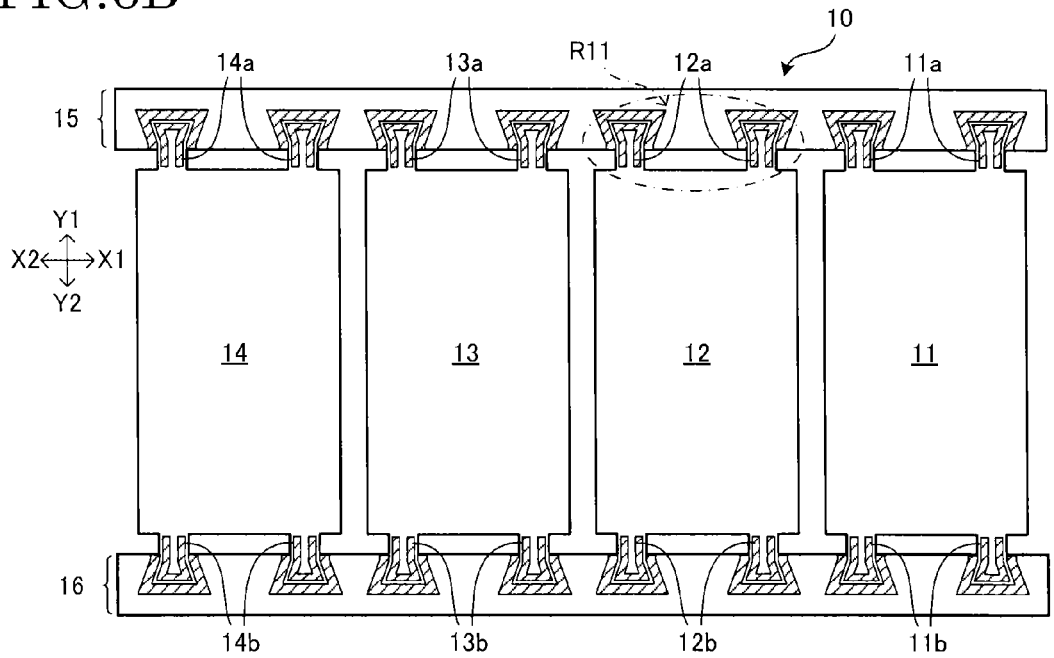
FIG. 6B is a plan view schematically showing the other main surface of the first board prepared in the step in FIG. 5.

FIG. 6B is a plan view schematically showing the other main surface of first board 10. As shown in FIGS. 6A and 6B, first board 10 has substantially the same structure as multi-piece board 100 (see FIGS. 1A and 1B). Namely, first board 10 has piece boards (11~14), frames (15, 16) and bridges (11a~14a, 11b~14b). Also, the material, shape and measurements of first board 10 are respectively the same as those of multi-piece board 100 (FIG. 1), for example. However, all piece boards (11~14) are integrated with frames (15, 16) in first board 10 at least at this stage. Here, the number of piece boards and the number of bridges per piece board or per frame in first board 10 may be modified freely. In addition, electronic components may be mounted on surfaces of piece boards or may be built into them.

Conductive patterns are formed on the connection part of each piece board and a frame in first board 10. The connection part of piece board 12 and frame 15 (the part corresponding to region (R11) in FIGS. 6A and 6B) is described in the following.

Figure 7A:
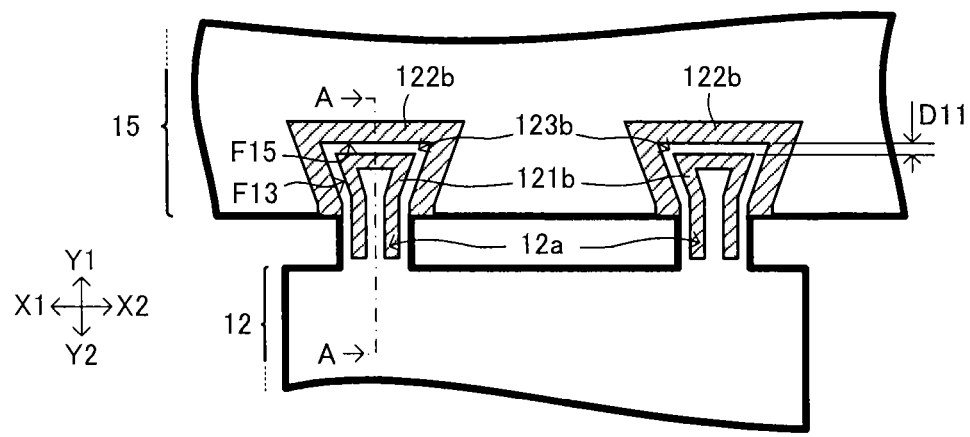
FIG. 7A is a plan view schematically showing a connection part of a piece board and a frame on one main surface of the first board shown in FIG. 6A.
Figure 7B:
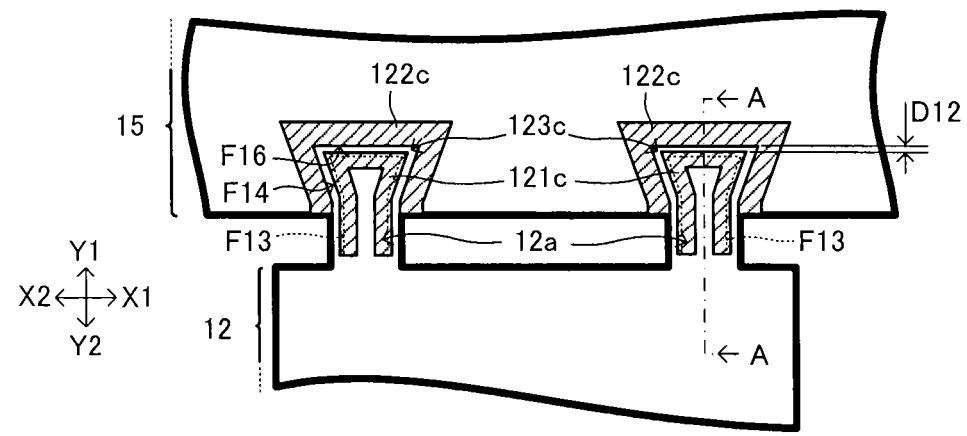
FIG. 7B is a plan view schematically showing a connection part of a piece board and a frame on the other main surface of the first board shown in FIG. 6B.
Figure 8:
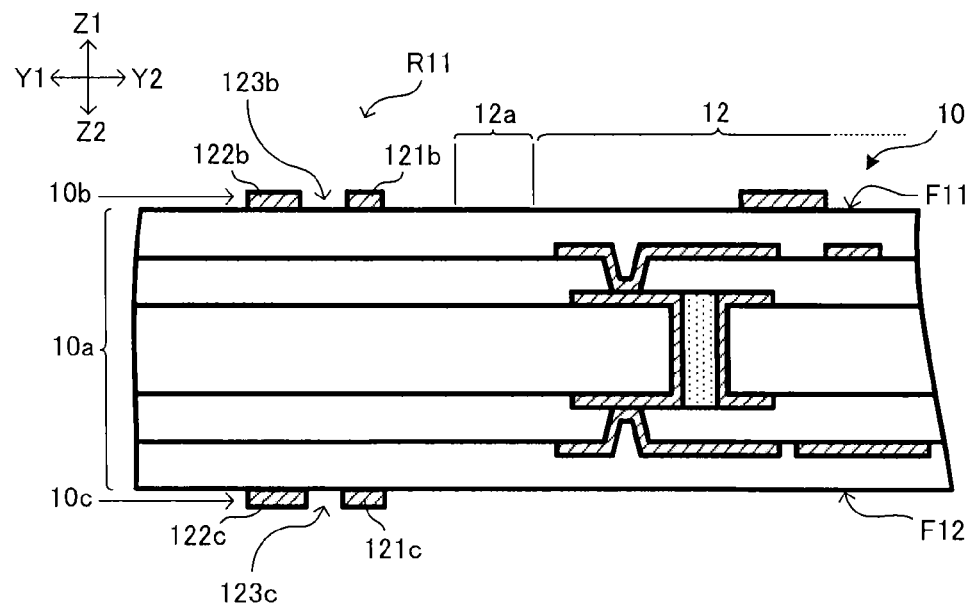
FIG. 8 is a cross-sectional view at (A-A) in FIG. 7A or 7B.
Figure 9:
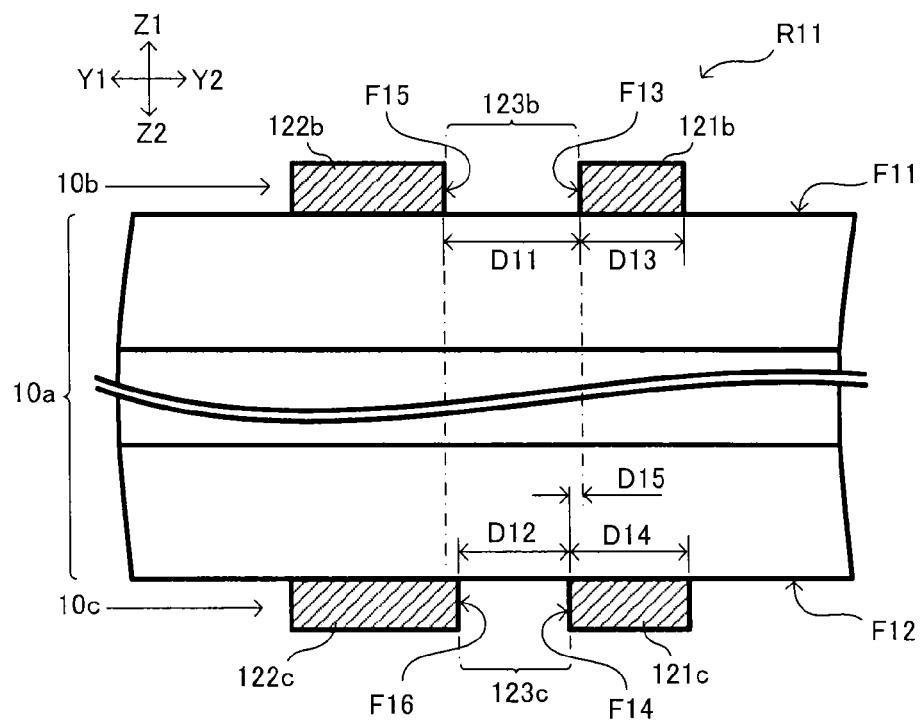
FIG. 9 is a partially enlarged view of FIG. 8.

FIG. 7A is a plan view schematically showing the connection part of piece board 12 and frame 15 on one main surface of first board 10. FIG. 7B is a plan view schematically showing the connection part of piece board 12 and frame 15 on the other main surface of first board 10. FIG. 8 is a cross-sectional view at (A-A) in FIG. 7A or 7B. FIG. 9 is a partially enlarged view of FIG. 8.

As shown in FIG. 8, first board 10 has substrate (10a) and conductive layers (10b, 10c). Substrate (10a) has first main surface (F11) (main surface on the Z1 side), and its opposing second main surface (F12) (main surface on the Z2 side). Conductive layer (10b) is formed on first main surface (F11) of substrate (10a), and conductive layer (10c) is formed on second main surface (F12) of substrate (10a). The thickness of substrate (10a) is 700 µm, for example, the thickness of conductive layer (10b) is 25 µm, for example, and the thickness of conductive layer (10c) is 25 µm, for example.

As shown in FIGS. 7A and 8, conductive layer (10b) includes conductive pattern (121b) and conductive pattern (122b). Conductive pattern (122b) has edge surface (F15) facing edge surface (F13) of conductive pattern (121b) as shown in FIGS. 7A and 9. Conductive pattern (121b) is formed in such a way that edge surface (F13) is positioned in a part where a laser beam is irradiated in a later-described cutting process (step (S13) of FIG. 4). Also, linear slit (123b) (in substantially a U-shape, for example) is formed along a scanning direction of laser irradiation (direction to move irradiation spots) during the later-described cutting process (step (S13) of FIG. 4) between edge surface (F13) of conductive pattern (121b) and edge surface (F15) of conductive pattern (122b). Namely, in the present embodiment, conductive patterns (121b, 122b) (first conductive patterns) with slit (123b) (first slit) are formed on first main surface (F11) of substrate (10a). As shown in FIG. 7A, edge surface (F13) of conductive pattern (121b) is formed along the periphery of convex portion (P2) (plug-in portion (P21) and bridge (P22)) which is cut out in the later-described cutting process (step (S13) of FIG. 4). In the present embodiment, conductive pattern (121b) is formed in a linear shape corresponding to the outline of convex portion (P2) (substantially a U-shape, for example). Conductive pattern (122b) is also formed in a linear shape (substantially a U-shape, for example).

In the present embodiment, conductive patterns (121b, 122b) and slit (123b) each have a constant width, for example. In FIG. 9, width (D11) of slit (123b) is 280 μm, for example, and width (D13) of conductive pattern (121b) is 450 μm, for example. Conductive patterns (121b, 122b) may be formed as planar conductive patterns. Conductive pattern (122b) may cover substantially the entire frame 15.

As shown in FIGS. 7B and 8, conductive layer (10c) includes conductive pattern (121c) and conductive pattern (122c). Conductive pattern (121c) is formed on second main surface (F12) of substrate (10a) facing conductive pattern (121b), and has edge surface (F14) which is positioned away (toward the Y1 side in FIG. 9) from edge surface (F13) of conductive pattern (121b) as shown in FIGS. 7A, 7B and 9. In FIG. 9, amount of protrusion (D15) at edge surface (F14) (the amount shifted from the position of edge surface (F13) of conductive pattern (121b) to the position of edge surface (F14) of conductive pattern (121c)) is 90 μm, for example. Also, as shown in FIGS. 7A, 7B and 9, edge surface (F16) of conductive pattern (122c) is positioned away (toward the Y2 side in FIG. 9) from edge surface (F15) of conductive pattern (122b) in the present embodiment.

Conductive pattern (122c) has edge surface (F16) facing edge surface (F14) of conductive pattern (121c) as shown in FIGS. 7B and 9. Linear slit (123c) corresponding to the shape of slit (123b) (in substantially a U-shape, for example) is formed between edge surface (F14) of conductive pattern (121c) and edge surface (F16) of conductive pattern (122c). Namely, on second main surface (F12) of substrate (10a) in the present embodiment, conductive patterns (121c, 122c) (second conductive patterns) are formed to have slit (123c) (second slit) which faces slit (123b). However, width (D11) of slit (123b) is set greater than width (D12) of slit (123c) in FIG. 9. Specifically, edge surface (F14) of conductive pattern (121c) and edge surface (F16) of conductive pattern (122c) are positioned away from edge surface (F13) of conductive pattern (121b) and edge surface (F15) of conductive pattern (122b) respectively (toward their respective sides to make width (D12) of slit (123c) narrower). Thus, width (D12) of slit (123c) is made narrower than width (D11) of slit (123b). In the present embodiment, conductive pattern (121c) is formed in a linear shape corresponding to the shape of conductive pattern (121b) (in substantially a U-shape, for example). Also, conductive pattern (122c) is formed in a linear shape corresponding to the shape of conductive pattern (122b) (in substantially a U-shape, for example).

In the present embodiment, conductive patterns (121c, 122c) and slit (123c) each have a constant width, for example.

In FIG. 9, width (D12) of slit (123c) is 100 μm, for example, and width (D14) of conductive pattern (121c) is 450 μm, for example. It is an option to form conductive patterns (121c, 122c) as planar conductive patterns. It is also an option for conductive pattern (122c) to cover substantially the entire frame 15.

Conductive layers (10b, 10c) (subsequently, conductive patterns (121b, 122b, 121c, 122c)) are each made of electroless copper-plated film (lower layer), for example, and electrolytic copper-plated film (upper layer), for example. Electrolytic plated film is formed using the electroless plated film as a seed layer. However, that is not the only option, and the formation of conductive layers (10b, 10c) is not limited specifically. For example, conductive layers (10b, 10c) may each be made of copper foil (lower layer), electroless copper-plated film (middle layer) and electrolytic copper-plated film (upper layer). Conductive layers (10b, 10c) may be formed by, for example, any one or any combination of two or more methods such as panel plating, pattern plating, full-additive, semi-additive (SAP), subtractive, transfer and tenting methods. Conductive layers (10b, 10c) are each preferred to be made of metal.

In the present embodiment, conductive layers (10b, 10c) correspond to their respective outermost conductive layers of piece board 12 (wiring board). Therefore, conductive layers (10b, 10c) include wiring patterns or the like that form electrical circuits in addition to above conductive patterns (121b, 122b, 121c, 122c).

As shown in FIG. 8, no conductive pattern is formed in the inner layers of substrate (10a) and there are only insulation layers (such as resin) existing in the connection part (region (R11)) of piece board 12 and frame 15 in first board 10 of the present embodiment shown in FIGS. 6A and 6B. Accordingly, it is easier to cut substrate (10a) by a laser in the later-described cutting process (step (S13) of FIG. 4).

Each connection part of piece boards (11, 13, 14) and frame 15 and each connection part of piece board (11~14) and frame 16 have the same structure as the connection part of piece board 12 and frame 15 described above (see FIGS. 7A~9).

Next, in step (S12) of FIG. 4, a conduction inspection is performed on each of piece boards (11~14) of first board 10. Then, when it is found that there is a defective piece board among piece boards (11~14), good pieces (piece boards without abnormalities) are cut out from first board 10 in subsequent step (S13).

On the other hand, when it is found that there is no defective board in the conduction inspection of step (S12), the cutting process in step (S13) is not conducted. First board 10 (multi-piece board) whose piece boards are all found to be good is used as a product, for example.

In the following, an example is described where only piece board 11 is found to be defective in the conductive inspection in step (S12) of FIG. 4. Namely, in subsequent step (S13) of FIG. 4, other piece boards (12~14) (each a good piece) are cut out from first board 10. Cutting process in step (S13) of FIG. 4 is described by an example where piece board 12 is cut out from first board 10.

In the present embodiment, a $CO_2$ laser, for example is used to irradiate laser on substrate (10a) so that part of substrate (10a) is cut out as a piece board. Specifically, a first laser irradiation for processing substrate (10a) is performed by irradiating a laser beam on slit (123b) from the first main-surface (F11) side, and a second laser irradiation for processing substrate (10a) is performed by irradiating a laser beam on slit (123c) from the second main-surface (F12) side in the present embodiment. By such first laser irradiation and second laser irradiation, substrate (10a) is cut from first main surface (F11) through second main surface (F12). In addition, after a recess is formed in substrate (10a) by the first laser irradiation, the portion facing the recess is processed by the second laser irradiation in the present embodiment so that substrate (10a) is cut from first main surface (F11) through second main surface (F12).

Figure 10A:
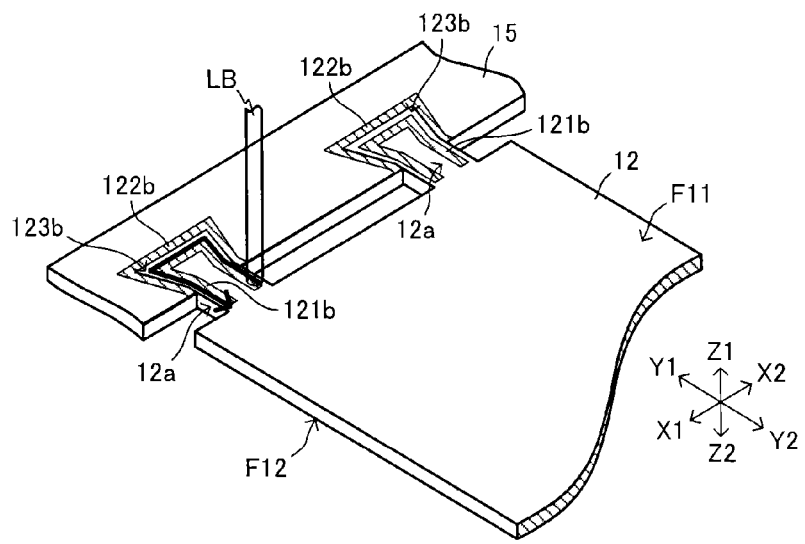
FIG. 10A, in the method shown in FIG. 4, is a perspective view illustrating a step for forming a recess in a first board by a first laser irradiation.
Figure 10B:
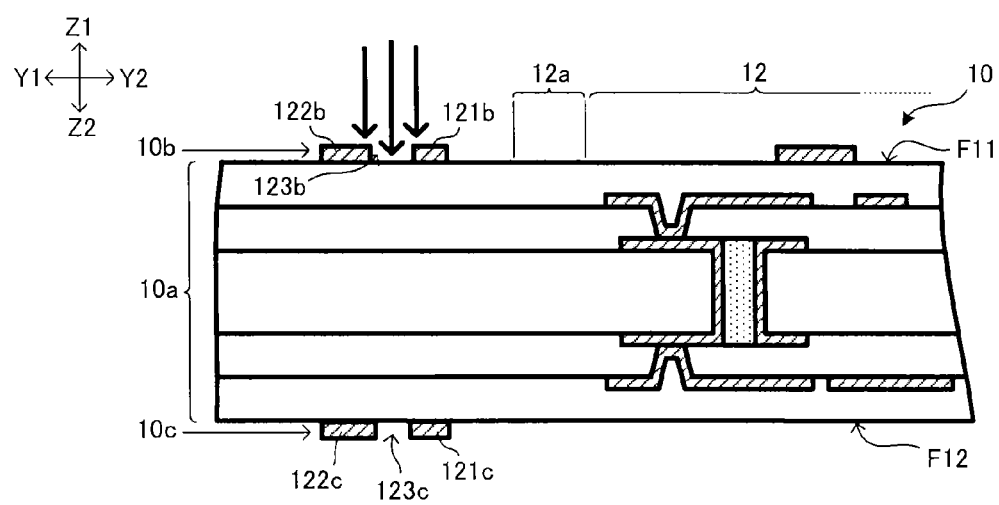
FIG. 10B, in the method shown in FIG. 4, is a cross-sectional view illustrating a step for forming a recess in a first board by a first laser irradiation.
Figure 11:
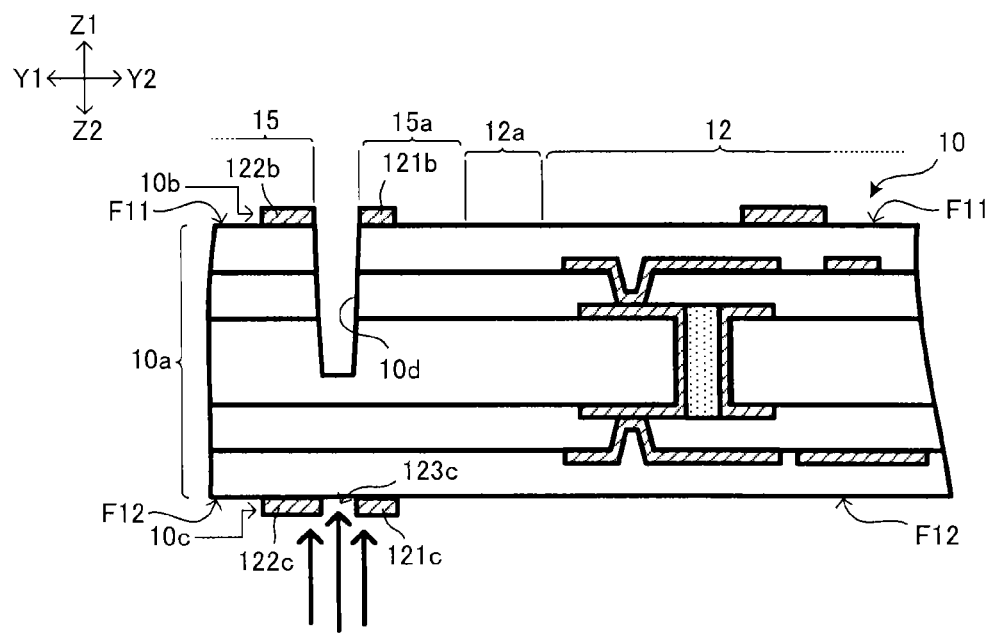
FIG. 11, in the method shown in FIG. 4, is a view illustrating a step for cutting a first board by a second laser irradiation.

Specifically, as shown in FIGS. 10A and 10B, laser beam (LB) is irradiated on slit (123b) from the first main-surface (F11) side (first laser irradiation), and irradiation spots of laser beam (LB) are moved along slit (123b). Accordingly, recess (10d) is formed in substrate (10a) as shown in FIG. 11. The width (width in direction Y) of recess (10d) decreases toward the bottom.

Figure 12:
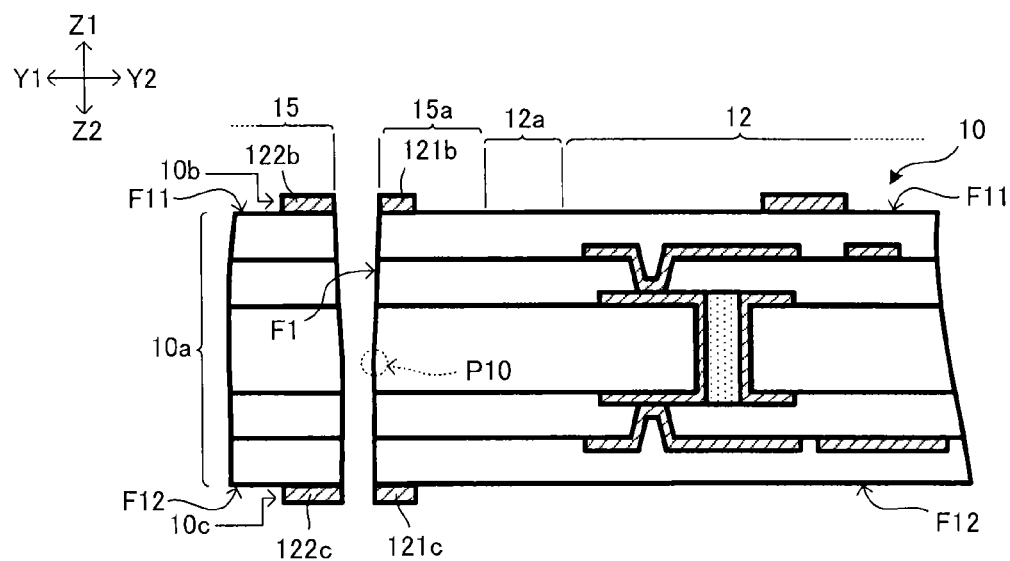
FIG. 12 is a view showing the cut surface of the first board formed in the step shown in FIG. 12.

Next, as shown in FIG. 11, by irradiating a laser beam on slit (123c) from the second main-surface (F12) side (second laser irradiation), the portion facing recess (10d) is processed. The same as the first laser irradiation (see FIG. 10A), irradiation spots of a laser beam are moved along slit (123c) at that time as well. A recess is formed by the second laser irradiation, and the recess is subsequently joined with recess (10d) formed by the first laser irradiation above. Accordingly, cut surface (F1) (first cut surface) is formed in substrate (10a), connecting edge surface (F13) of conductive pattern (121b) (see FIG. 9) and edge surface (F14) of conductive pattern (121c) (see FIG. 9) as shown in FIG. 12. As a result, piece board 12 is cut from frame 15. In addition, piece board 12 is also cut from frame 26 by the same method for cutting it from frame 15 (see FIGS. 10A~12). As a result, piece board 12 is cut from first board 10.

Figure 13:
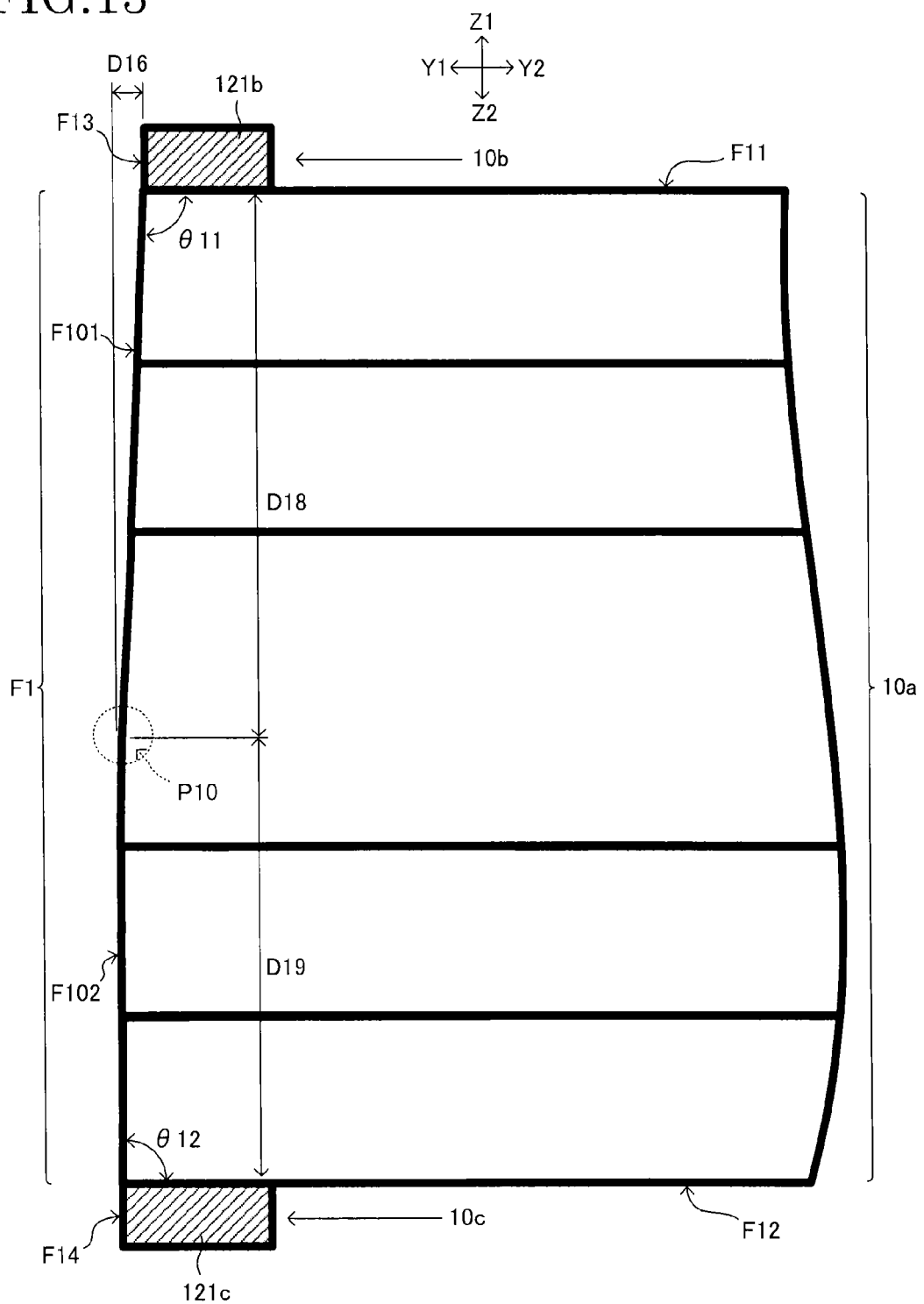
FIG. 13 is an enlarged view of the cut surface of the first board shown in FIG. 12.

Cut surface (F1) has a portion protruding from edge surface (F13) of conductive pattern (121b), but has no portion protruding from edge surface (F14) of conductive pattern (121c) as shown in FIG. 13. Specifically, cut surface (F1) is formed with surface (F101), which protrudes gradually toward the outer side as it goes farther (deeper) from edge surface (F13) (tapering portion), and with surface (F102), which is made flush (forms the same surface) with edge surface (F14) (non-tapering portion). In the following, a portion positioned at the boundary between surface (F101) and surface (F102) is referred to as boundary portion (P10).

In FIG. 13, angle (θ11) made by first main surface (F11) and surface (F101) is greater than 90 degrees. Also, angle (θ12) made by second main surface (F12) and surface (F102) is approximately 90 degrees. Surface (F101) protrudes from edge surface (F13) of conductive pattern (121b), and protrudes the most at boundary portion (P10). Boundary portion (P10) is formed at substantially the same position (Y coordinate) as edge surface (F14). Then, surface (F102) connecting boundary portion (P10) and edge surface (F14) of conductive pattern (121c) makes a flat surface. Namely, surface (F102) does not protrude from edge surface (F14). Cut surface (F1) does not have any portion protruding from edge surface (F14) of conductive pattern (121c).

Boundary portion (P10) is formed near the bottom of recess (10d) formed by the first laser irradiation (see FIG. 11). In FIG. 13, depth (D18) of boundary portion (P10) (distance from first main surface (F11) to boundary portion (P10)) is 575 μm, for example, and depth (D19) of boundary portion (P10) (distance from second main surface (F12) to boundary portion (P10)) is 125 μm, for example. Amount of protrusion (D16) at boundary portion (P10) from edge surface (F13) of conductive pattern (121b) is 90 μm, for example, and the amount of protrusion at boundary portion (P10) from edge surface (F14) of conductive pattern (121c) is 0 μm, for example.

Figure 14:
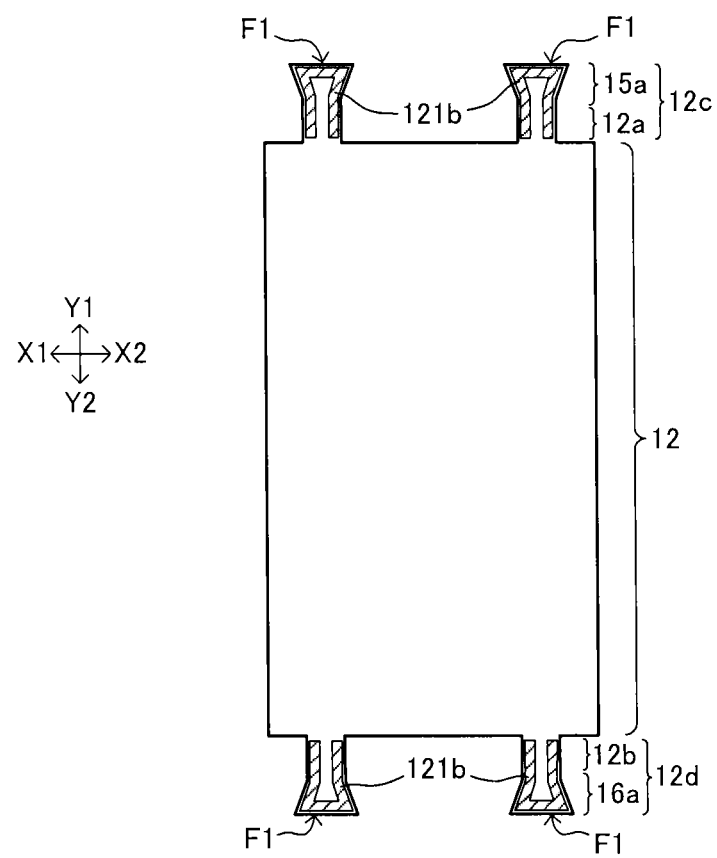
FIG. 14 is a view of a piece board that is cut out from the first board by the first laser irradiation and the second laser irradiation.

As shown in FIG. 14, piece board 12 cut from first board 10 has multiple (such as two) convex portions (12c) formed on one side (a side on the Y1 side, for example) and multiple (such as two) convex portions (12d) formed on the other side (a side on the Y2 side, for example). Convex portion (12c) is made up of plug-in portion (15a) (tip portion) and bridge (12a) (base portion), and convex portion (12d) is made up of plug-in portion (16a) and bridge (12b). Plug-in portions (15a, 16a) each correspond to plug-in portion (P21) shown previously in FIG. 3, and bridges (12a, 12b) each correspond to bridge (P22) previously shown in FIG. 3.

In the present embodiment, piece boards (13, 14) are also cut from first board 10 the same as piece board 12. In the present embodiment, piece boards (12~14) are each cut out from first board 10 using a laser.

Figure 15:
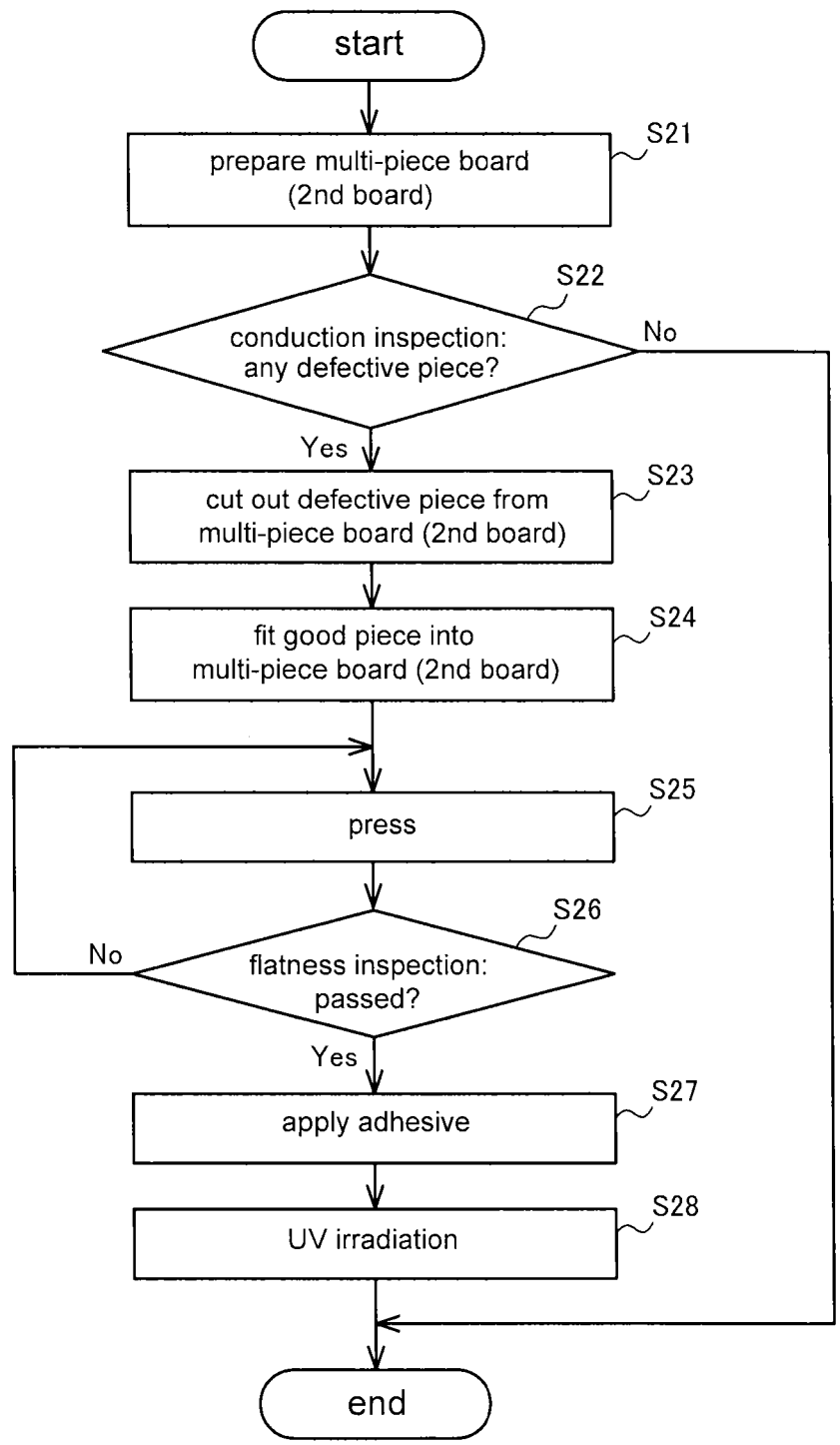
FIG. 15, in the method for manufacturing a multi-piece board according to the embodiment of the present invention (plug-in board replacement method), is a flowchart showing a method for manufacturing a multi-piece board according to the embodiment of the present invention by fitting a good piece that is cut out by the method shown in FIG. 4 into a second board.

Next, using the procedure shown in FIG. 15, for example, a good piece (first wiring board) is fitted into second board 20 (multi-piece board) to manufacture multi-piece board 100 (FIGS. 1A and 1B) according to the present embodiment.

In step (S21) of FIG. 15, second board 20 (different board from first board 10) is prepared. Second board 20 is a multi-piece board. In the present embodiment, multiple second boards 20 are manufactured in a manufacturing panel, the same as first boards 10, for example (see FIG. 5). Then, an individual unit of second board 20 is obtained the same as first board 10, for example.

Figure 16A:
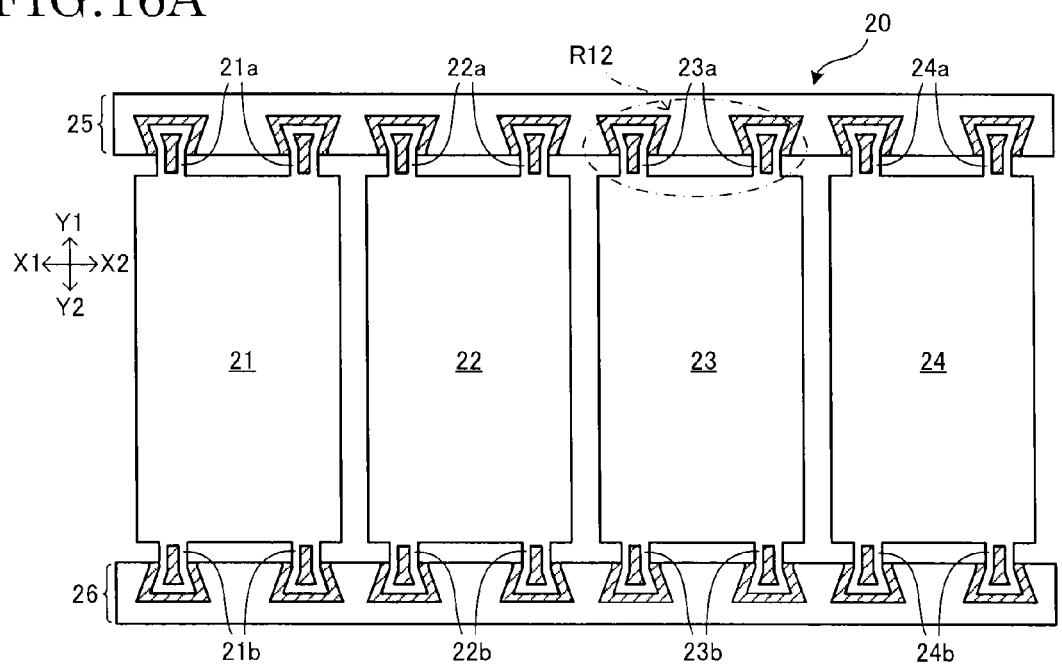
FIG. 16A is a plan view schematically showing one main surface of a second board prepared by the method shown in FIG. 15.
Figure 16B:
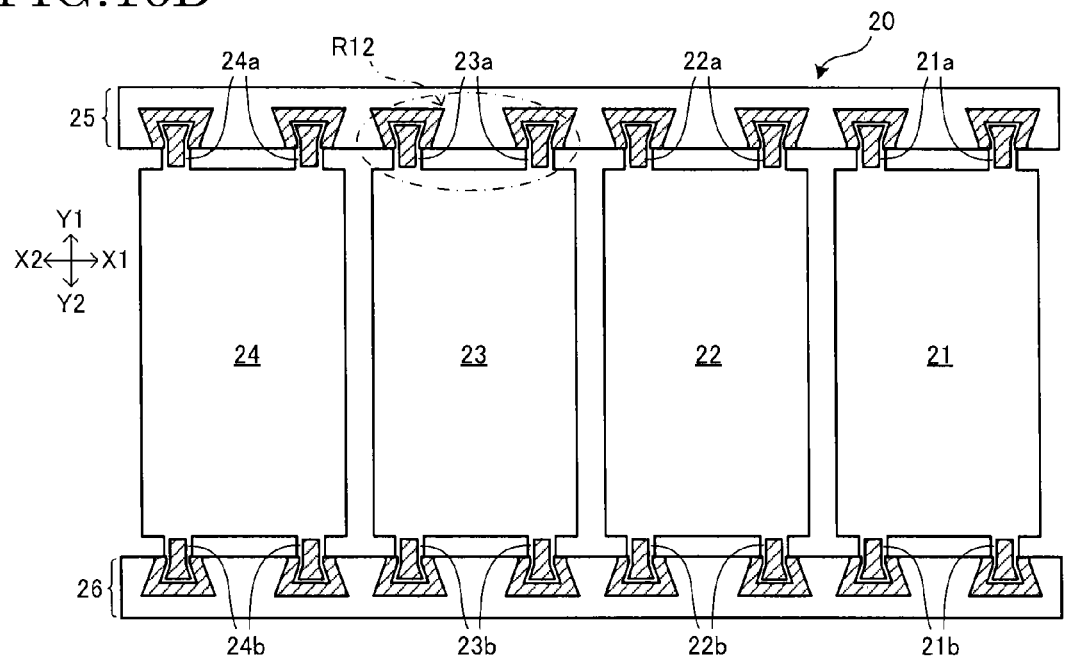
FIG. 16B is a plan view schematically showing the other main surface of the second board prepared by the method shown in FIG. 15.

FIG. 16A is a plan view schematically showing one main surface of second board 20. FIG. 16B is a plan view schematically showing the other main surface of second board 20.

As shown in FIGS. 16A and 16B, second board 20 has substantially the same structure as multi-piece board 100 (FIG. 1). Namely, second board 20 has piece boards (21~24), frames (25, 26) and bridges (21a~24a, 21b~24b). Also, the material, shape and measurements of second board 20 are the same as those of multi-piece board 100 (FIG. 1) respectively, for example. However, in second board 20, all piece boards (21~24) and frames (25, 26) are integrated at least at this stage. The number of piece boards and the number of bridges per piece board or per frame in second board 20 may be modified freely. In addition, electronic components may be mounted on surfaces of piece boards or may be built into them.

Conductive patterns are formed on the connection part of each piece board and a frame in second board 20. The connection part of piece board 23 and frame 25 (part corresponding to region (R12) in FIGS. 16A and 16B) is described in the following.

Figure 17A:
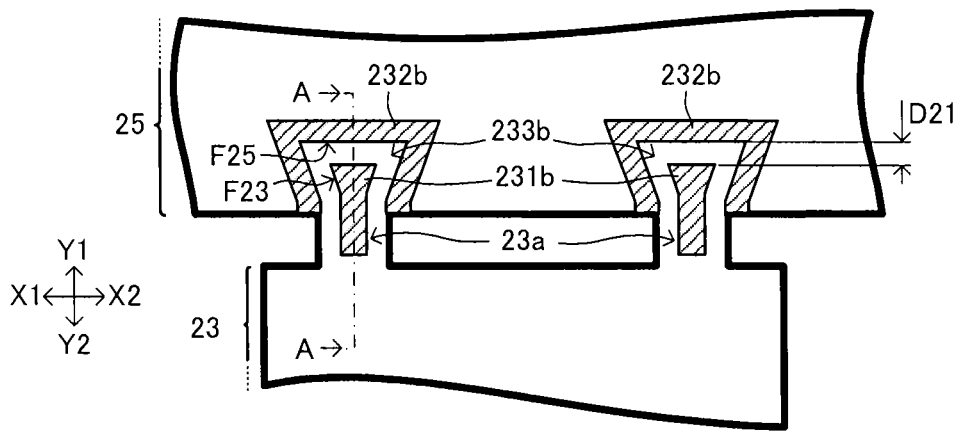
FIG. 17A is a plan view schematically showing a connection part of a piece board and a frame on one main surface of the second board shown in FIG. 16A.
Figure 17B:
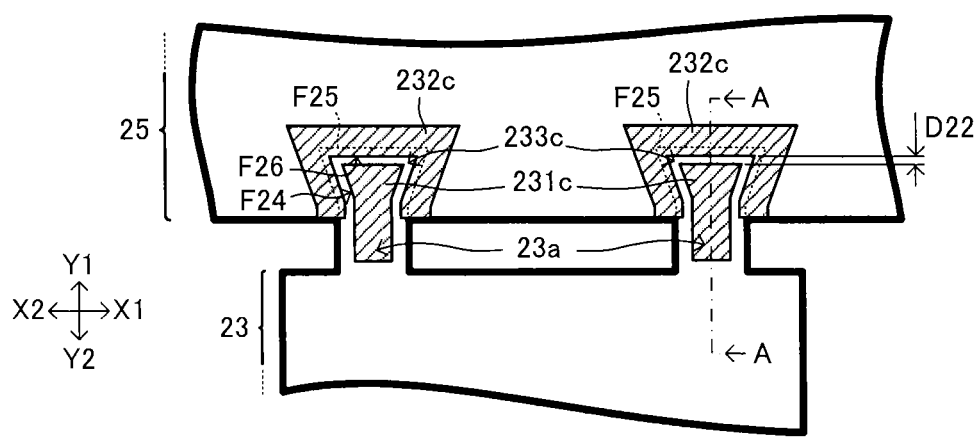
FIG. 17B is a plan view schematically showing a connection part of a piece board and a frame on the other main surface of the second board shown in FIG. 16B.
Figure 18:
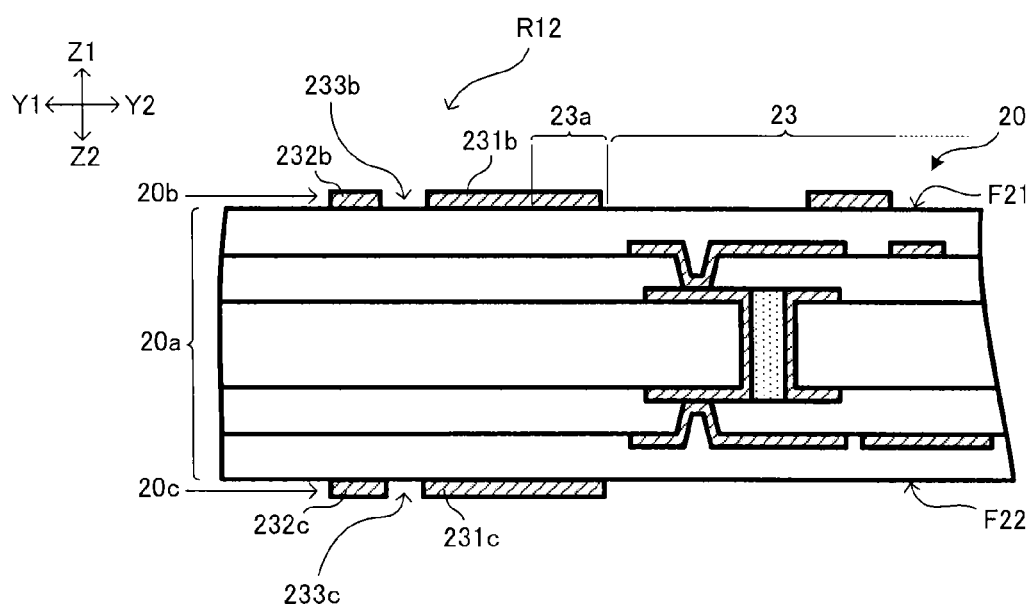
FIG. 18 is a cross-sectional view at (A-A) in FIG. 17A or 17B.
Figure 19:
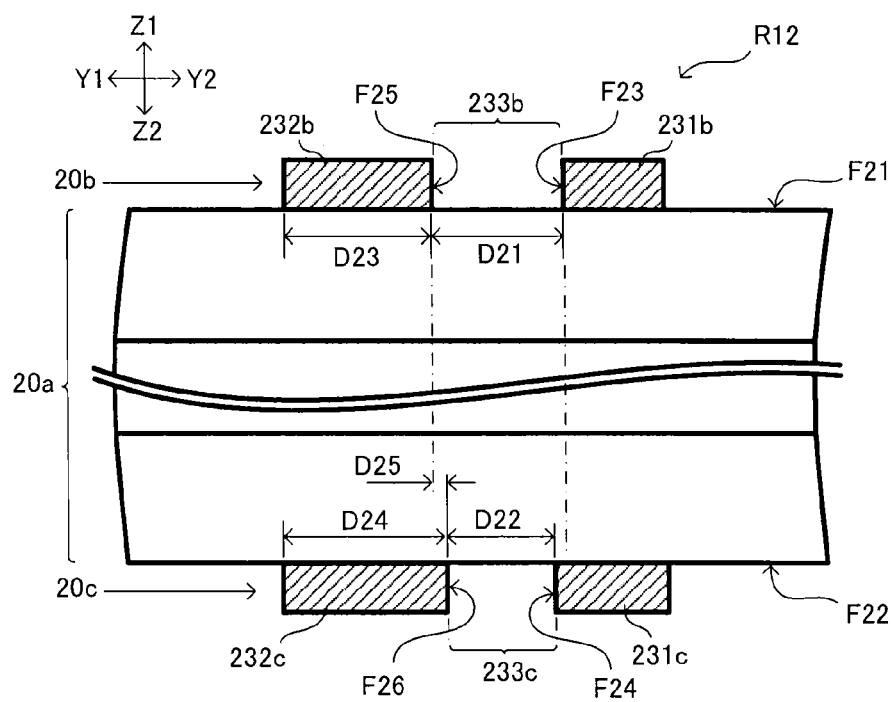
FIG. 19 is a partially enlarged view of FIG. 18.

FIG. 17A is a plan view schematically showing the connection part of piece board 23 and frame 25 on one main surface of second board 20. FIG. 17B is a plan view schematically showing the connection part of piece board 23 and frame 25 on the other main surface of second board 20. FIG. 18 is a cross-sectional view at (A-A) in FIG. 17A or 17B. FIG. 19 is a partially enlarged view of FIG. 18.

As shown in FIG. 18, second board 20 has substrate (20a) and conductive layers (20b, 20c). Substrate (20a) has third main surface (F21) (main surface on the Z1 side) and its opposing fourth main surface (F22) (main surface on the Z2 side). Conductive layer (20b) is formed on third main surface (F21) of substrate (20a), and conductive layer (20c) is formed on fourth main surface (F22) of substrate (20a). The thickness of substrate (20a) is 700 μm, for example, the thickness of conductive layer (20b) is 25 μm, for example, and the thickness of conductive layer (20c) is 25 μm, for example.

As shown in FIGS. 17A and 18, conductive layer (20b) includes conductive pattern (231b) and conductive pattern (232b). Conductive pattern (231b) has edge surface (F25) facing edge surface (F23) of conductive pattern (231b) as shown in FIGS. 17A and 19. Conductive pattern (232b) is formed in such a way that edge surface (F25) is positioned in a part where a laser beam is irradiated in a later-described cutting process (step (S23) of FIG. 15). Also, linear slit (233b) (in substantially a U-shape, for example) is formed along a scanning direction of laser irradiation (direction to move irradiation spots) during the later-described cutting process (step (S23) of FIG. 15) between edge surface (F23) of conductive pattern (231b) and edge surface (F25) of conductive pattern (232b). Namely, in the present embodiment, conductive patterns (231b, 232b) (third conductive patterns) with slit (233b) (third slit) are formed on third main surface (F21) of substrate (20a). As shown in FIG. 17A, edge surface (F25) of conductive pattern (232b) is formed along the periphery of plug-in portion (P1) (concave portion) shown in FIG. 3 which is formed in the later-described cutting process (step (S23) of FIG. 15). In the present embodiment, conductive pattern (232b) is in a linear shape (in substantially a U-shape) corresponding to the outline of plug-in portion (P1). In addition, conductive pattern (231b) is formed in a planar shape.

In the present embodiment, conductive pattern (232b) and slit (233b) each have a constant width, for example. In FIG. 19, width (D21) of slit (233b) is 280 μm, for example, and width (D23) of conductive pattern (232b) is 450 μm, for example. Conductive pattern (232b) may be formed as a planar conductive pattern. Conductive pattern (232b) may cover substantially the entire frame 25.

As shown in FIGS. 17B and 18, conductive layer (20c) includes conductive pattern (231c) and conductive pattern (232c). Conductive pattern (232c) is formed on fourth main surface (F22) of substrate (20a) which faces conductive pattern (232b), and has edge surface (F26) which is positioned away (toward the Y2 side in FIG. 19) from edge surface (F25) of conductive pattern (232b) as shown in FIGS. 17A, 17B and 19. In FIG. 19, amount of protrusion (D25) at edge surface (F26) (the amount shifted from the position of edge surface (F25) of conductive pattern (232b) to the position of edge surface (F26) of conductive pattern (232c)) is 90 μm, for example. Also, as shown in FIGS. 17A, 17B and 19, edge surface (F24) of conductive pattern (231c) is positioned away (toward the Y1 side in FIG. 19) from edge surface (F23) of conductive pattern (231b) in the present embodiment.

Conductive pattern (232c) has edge surface (F26) facing edge surface (F24) of conductive pattern (231c) as shown in FIGS. 17B and 19. Linear slit (233c) corresponding to the shape of slit (233b) (in insubstantially a U-shape, for example) is formed between edge surface (F24) of conductive pattern (231c) and edge surface (F26) of conductive pattern (232c). Namely, on fourth main surface (F22) of substrate (20a) in the present embodiment, conductive patterns (231c, 232c) (fourth conductive patterns) are formed to have slit (233c) (fourth slit) which faces slit (233b). However, width (D21) of slit (233b) is set greater than width (D22) of slit (233c) in FIG. 19. Specifically, edge surface (F24) of conductive pattern (231c) and edge surface (F26) of conductive pattern (232c) are positioned away from edge surface (F23) of conductive pattern (231b) and edge surface (F25) of conductive pattern (232b) respectively (toward their respective sides to make width (D22) of slit (233c) narrower). Thus, width (D22) of slit (233c) is made narrower than width (D21) of slit (233b). In the present embodiment, conductive pattern (232c) is formed in a linear shape corresponding to the shape of conductive pattern (232b) (in substantially a U-shape, for example). Also, conductive pattern (231c) is formed in a planar shape.

In the present embodiment, conductive pattern (232c) and slit (233c) each have a constant width, for example. In FIG. 19, width (D22) of slit (233c) is 100 μm, for example, and width (D24) of conductive pattern (232c) is 450 μm, for example. Conductive pattern (232c) may be formed as a planar conductive pattern. Conductive pattern (232c) may cover substantially the entire frame 25.

Conductive layers (20b, 20c) (subsequently, conductive patterns (231b, 232b, 231c, 232c)) are each made of electroless copper-plated film (lower layer), and electrolytic copper-plated film (upper layer), for example. Electrolytic plated film is formed using the electroless plated film as a seed layer. However, that is not the only option, and the formation of conductive layers (20b, 20c) is not limited specifically. For example, conductive layers (20b, 20c) may each be made of copper foil (lower layer), electroless copper-plated film (middle layer) and electrolytic copper-plated film (upper layer), for example. Conductive layers (20b, 20c) may be formed by, for example, any one or any combination of two or more methods such as panel plating, pattern plating, full-additive, semi-additive (SAP), subtractive, transfer and tenting methods. Conductive layers (20b, 20c) are each preferred to be made of metal.

In the present embodiment, conductive layers (20b, 20c) correspond to their respective outermost conductive layers of piece board 23 (wiring board). Therefore, in addition to above conductive patterns (231b, 232b, 231c, 232c), conductive layers (20b, 20c) include wiring patterns or the like that form electrical circuits.

As shown in FIG. 18, no conductive pattern is formed in the inner layers of substrate (20a) and there are only insulation layers (such as resin) existing in the connection part (region (R12)) of piece board 23 and frame 25 in second board 20 of the present embodiment shown in FIGS. 16A and 16B. Accordingly, it is easier to cut substrate (20a) with a laser in the later-described cutting process (step (S23) of FIG. 15).

Each connection part of piece boards (21, 22, 24) and frame 25 and each connection part of piece boards (21~24) and frame 26 have the same structure as the connection part of piece board 23 and frame 25 described above (see FIGS. 17A~19).

Next, in step (S22) of FIG. 15, a conduction inspection is performed on each of piece boards (21~24) of second board 20. Then, when it is found that there is a defective piece board among piece boards (21~24), a defective piece (piece board with abnormalities) is cut out from second board 20 in subsequent step (S23).

On the other hand, when it is found that there is no defective board in the conduction inspection of step (S22), the cutting process in step (S23) is not conducted. Second board 20 (multi-piece board) whose piece boards are all found to be good is used as a product, for example.

In the following, an example is described where only piece board 23 is found to be defective in the conduction inspection in step (S22) of FIG. 15. Namely, in subsequent step (S23) of FIG. 15, piece board 23 (a defective piece) is cut out from second board 20. The cutting process in step (S23) of FIG. 15 (specifically, laser irradiation for forming a space) is conducted as follows, for example.

In the present embodiment, a $CO_2$ laser, for example, is used to conduct laser irradiation on substrate (20a) so that part of substrate (20a) (piece board 23) is cut out as a piece board. Specifically, a third laser irradiation for processing substrate (20a) is conducted in the present embodiment by irradiating a laser beam on slit (233b) from the third main-surface (F21) side, and a fourth laser irradiation for processing substrate (20a) is conducted by irradiating a laser beam on slit (233c) from the fourth main-surface (F22) side. By such third laser irradiation and fourth laser irradiation, substrate (20a) is cut from third main surface (F21) through fourth main surface (F22). In addition, after a recess is formed in substrate (20a) by the third laser irradiation, the portion facing the recess is processed by the fourth laser irradiation in the present embodiment so that substrate (20a) is cut from third main surface (F21) through fourth main surface (F22).

Figure 20A:
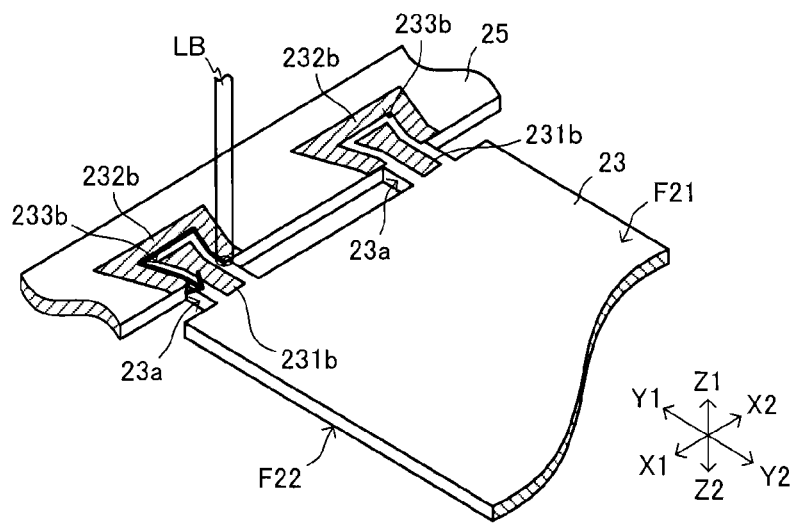
FIG. 20A, in the method shown in FIG. 15, is a perspective view illustrating a step for forming a recess in a second board by a third laser irradiation.
Figure 20B:
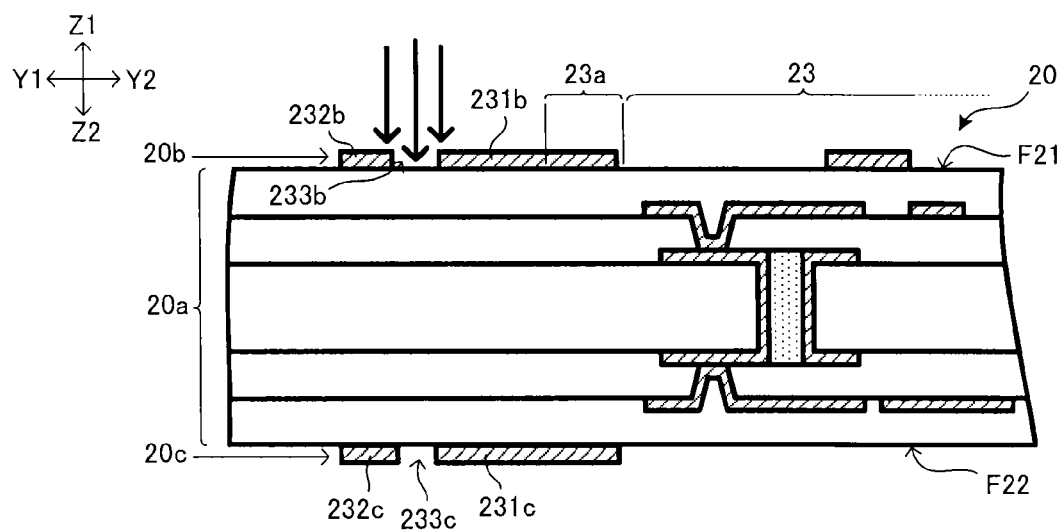
FIG. 20B, in the method shown in FIG. 15, is a cross-sectional view illustrating a step for forming a recess in a second board by a third laser irradiation.
Figure 21:
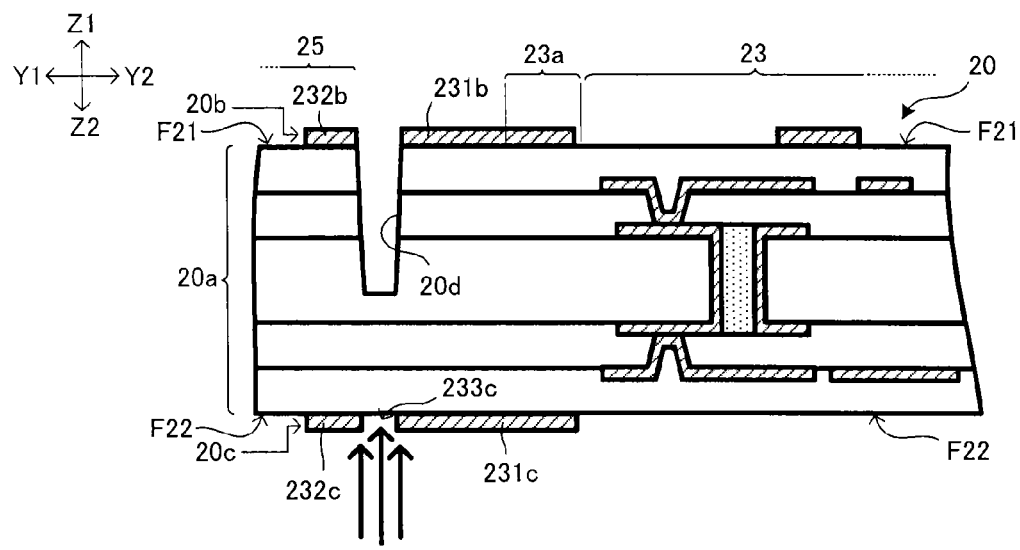
FIG. 21, in the method shown in FIG. 15, is a view illustrating a step for cutting a second board by a fourth laser irradiation.

Specifically, as shown in FIG. 20A, laser beam (LB) is irradiated on slit (233b) from the third main-surface (F21) side (third laser irradiation), and irradiation spots of laser beam (LB) are moved along slit (233b). Accordingly, recess (20d) is formed in substrate (20a) as shown in FIG. 21. The width (width in direction Y) of recess (20d) decreases toward the bottom.

Figure 22:
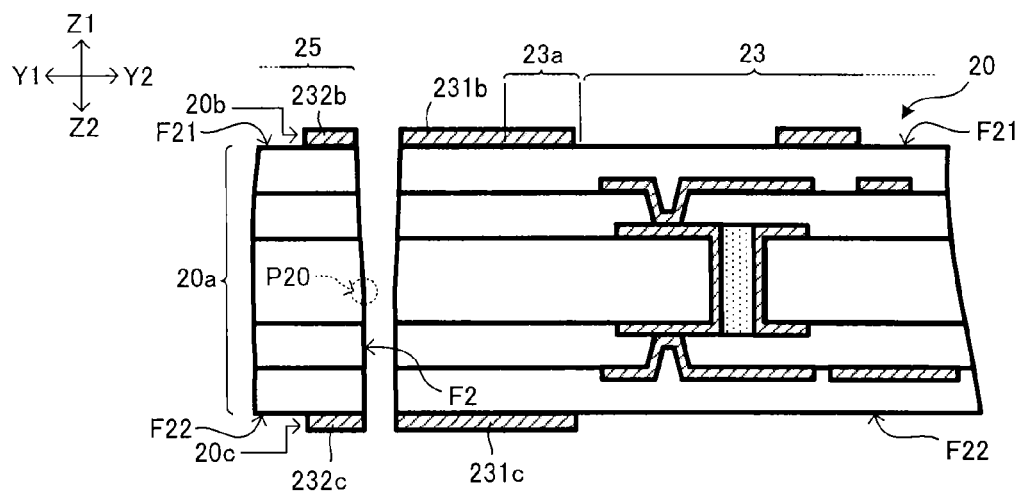
FIG. 22 is a view showing the cut surface of the second board formed in the step shown in FIG. 21.

Next, as shown in FIG. 21, by irradiating a laser beam on slit (233c) from the fourth main-surface (F22) side (fourth laser irradiation), the portion facing recess (20d) is processed. The same as the third laser irradiation (see FIG. 20A), irradiation spots of a laser beam are also moved along slit (233c) at that time. A recess is formed by the fourth laser irradiation, and the recess is subsequently joined with recess (20d) formed by the third laser irradiation above. Accordingly, cut surface (F2) (second cut surface) is formed in substrate (20a), connecting edge surface (F25) of conductive pattern (232b) (see FIG. 19) and edge surface (F26) of conductive pattern (232c) (see FIG. 19) as shown in FIG. 22. As a result, piece board 23 is cut from frame 25. In addition, piece board 23 is also cut from frame 26 by the same method for cutting it from frame 25 (see FIGS. 20A~22). As a result, piece board 23 is cut from second board 20.

Figure 23:
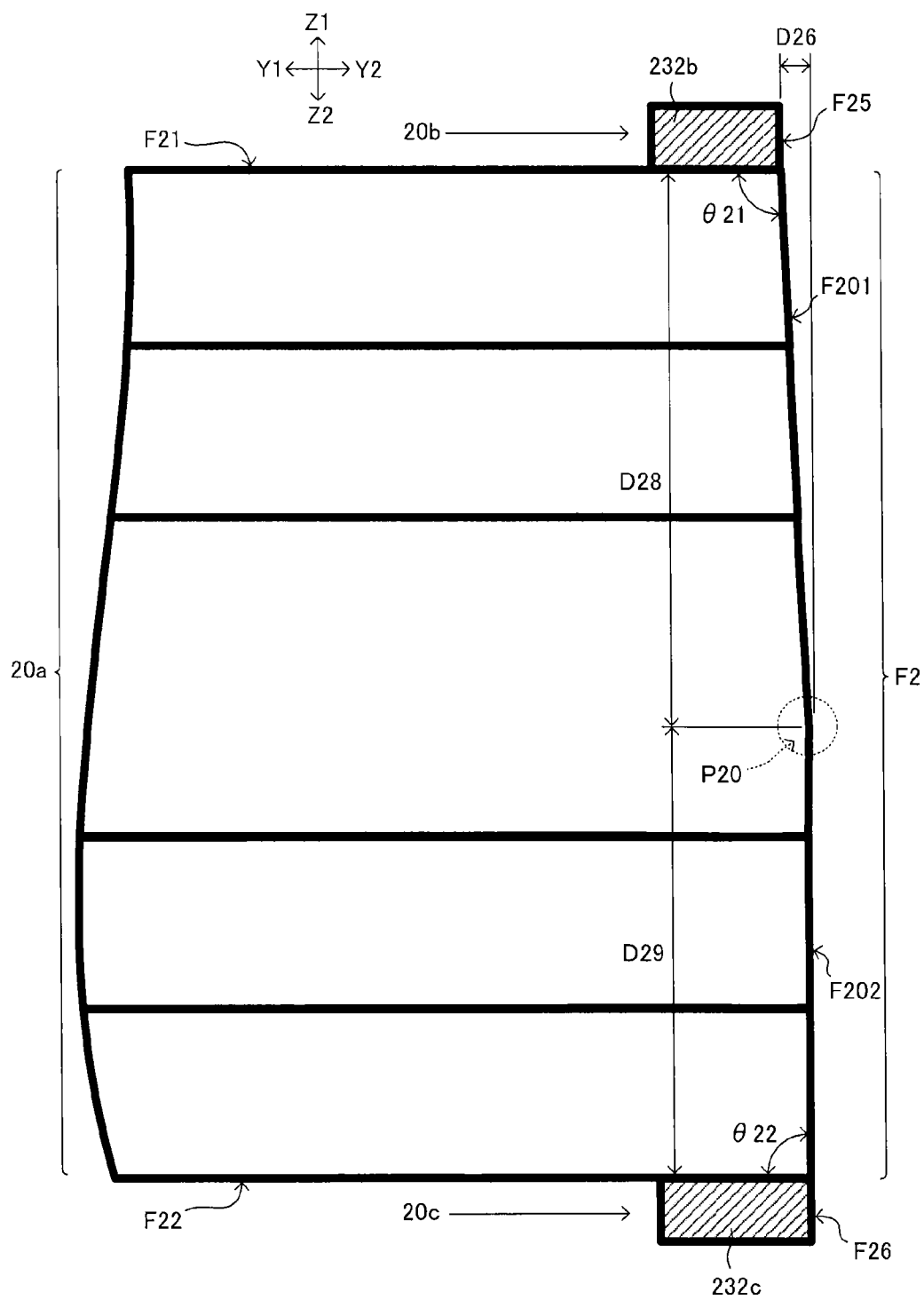
FIG. 23 is an enlarged view of the cut surface of the second board shown in FIG. 22.

Cut surface (F2) has a portion protruding from edge surface (F25) of conductive pattern (232b), but has no portion protruding from edge surface (F26) of conductive pattern (232c) as shown in FIG. 23. Specifically, cut surface (F2) is formed with surface (F201) which protrudes gradually toward the outer side as it goes farther (deeper) from edge surface (F25) (tapering portion), and surface (F202) which is made flush (forms the same surface) with edge surface (F26) (non-tapering portion). In the following, a portion positioned at the boundary between surface (F201) and surface (F202) is referred to as boundary portion (P20).

In FIG. 23, angle (θ21) made by third main surface (F21) and surface (F201) is greater than 90 degrees. Also, angle (θ22) made by fourth main surface (F22) and surface (F202) is approximately 90 degrees. Surface (F201) protrudes from edge surface (F25) of conductive pattern (232b) and protrudes the most at boundary portion (P20). Boundary portion (P20) is formed at substantially the same position (Y coordinate) as edge surface (F26). Then, surface (F202) connecting boundary portion (P20) and edge surface (F26) of conductive pattern (232c) is made flush. Namely, surface (F202) does not protrude from edge surface (F26). Cut surface (F2) does not have any portion protruding from edge surface (F26) of conductive pattern (232c).

Boundary portion (P20) is formed near the bottom of recess (20d) formed by the third laser irradiation (see FIG. 21). In FIG. 23, depth (D28) of boundary portion (P20) (distance from third main surface (F21) to boundary portion (P20)) is 575 μm, for example, and depth (D29) of boundary portion (P20) (distance from fourth main surface (F22) to boundary portion (P20)) is 125 μm, for example. Amount of protrusion (D26) at boundary portion (P20) from edge surface (F25) of conductive pattern (232b) is 90 μm, for example, and the amount of protrusion at boundary portion (P20) from edge surface (F26) of conductive pattern (232c) is 0 μm, for example.

Figure 24:
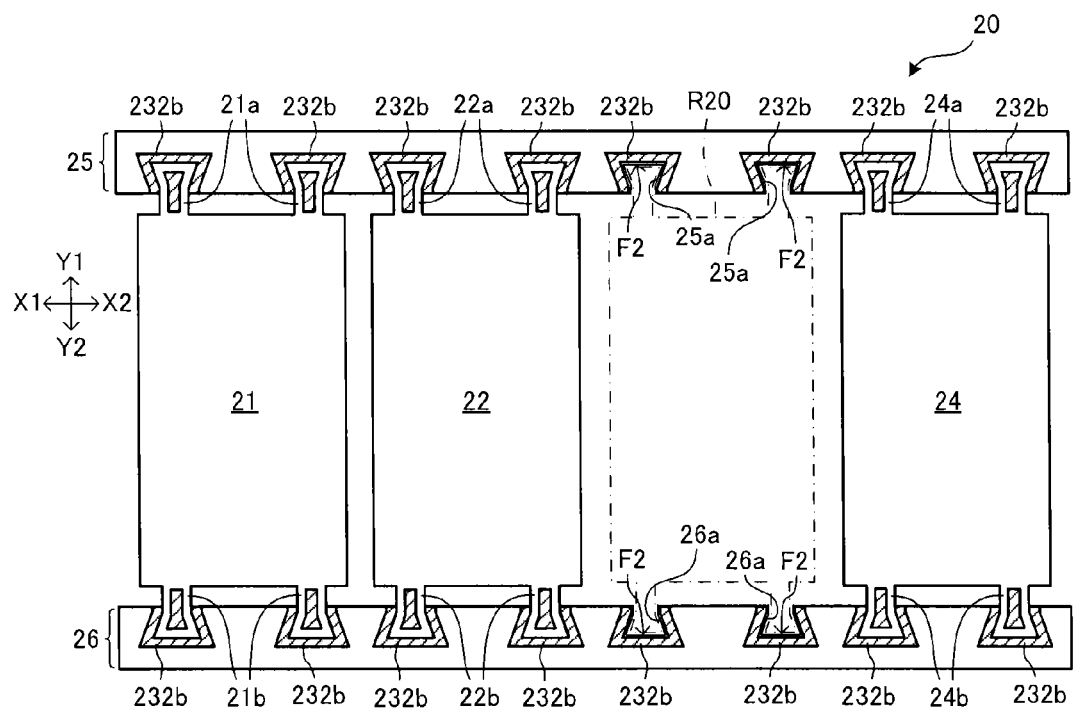
FIG. 24 is a view of a second board where a space is formed by a third laser irradiation and a fourth laser irradiation.

When piece board 23 is cut from second board 20, space (R20) is formed in second board 20 as shown in FIG. 24. Namely, in the present embodiment, by conducting laser irradiation on second board 20 from both the third main-surface (F21) side and the fourth main-surface (F22) side, a portion corresponding to space (R20) (piece board 23) is cut from second board 20 to form space (R20).

In addition, as shown in FIG. 24, plug-in portion (25a) (such as a concave portion) is formed in frame 25 by cutting piece board 23 from second board 20, and plug-in portion (26a) (such as a concave portion) is formed in frame 26. Plug-in portions (25a, 26a) each correspond to plug-in portion (P1) shown previously in FIG. 3.

Next, in step (S24) of FIG. 15, a piece board (good piece) cut out by the process in FIG. 4 is fitted into second board 20. In the following, a plug-in process in step (S24) of FIG. 15 is described by an example where piece board 12, among piece boards (12~14) (each a good piece) cut out by the process shown in FIG. 4, is fitted into second board 20.

Figure 25A:
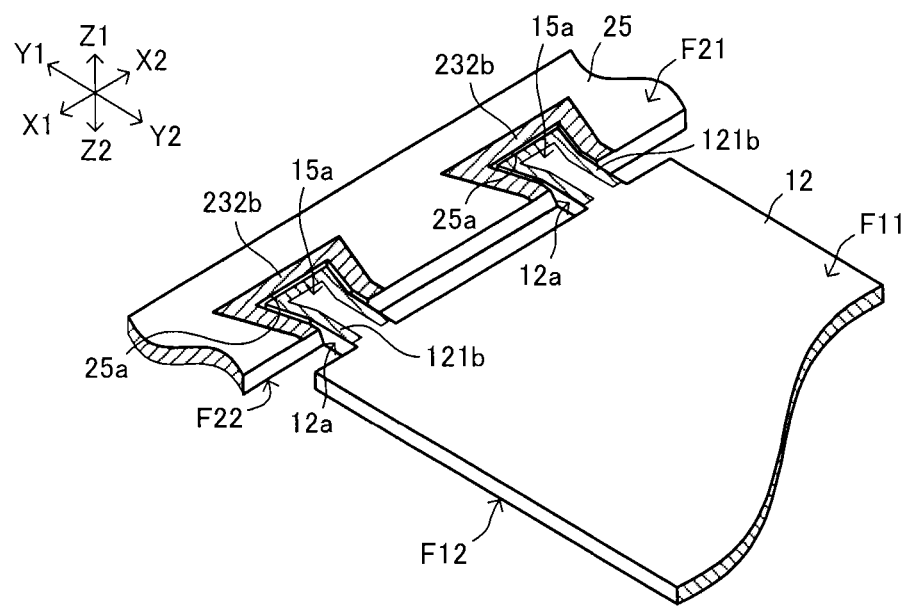
FIG. 25A is a perspective view illustrating a step to fit a good piece that is cut out by the method in FIG. 4 into the space of the second board shown in FIG. 24.
Figure 25B:
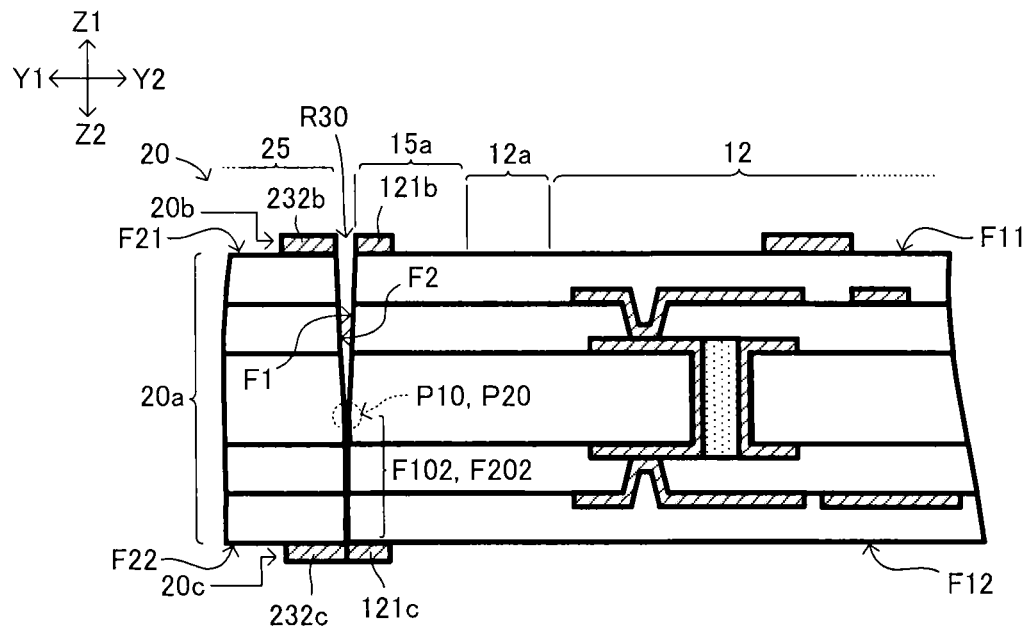
FIG. 25B is a cross-sectional view illustrating a step to fit a good piece that is cut out by the method shown in FIG. 4 into the space of the second board shown in FIG. 24.

In the present embodiment, as shown in FIGS. 25A and 25B, piece board 12 is fitted into second board 20 in such a way that first main surface (F11) of substrate (10a) and third main surface (F21) of substrate (20a) face the same direction. Specifically, plug-in portion (15a) (the tip of a convex portion, for example) of piece board 12 is fitted into plug-in portion (25a) (a concave portion, for example) of frame 25. Also, as shown in FIG. 26, plug-in portion (16a) of piece board 12 is fitted into plug-in portion (26a) of frame 26.

During that time, piece board 12 and second board 20 (in particular, frame 25) are fitted together so that edge surface (F26) of conductive pattern (232c) (FIG. 19) makes contact with edge surface (F14) of conductive pattern (121c) (FIG. 9) as shown in FIG. 25B. At that time, when edge surface (F14) (FIG. 9) and edge surface (F26) (FIG. 19) make contact with each other, surface (F102) (FIG. 13) and surface (F202) (FIG. 23) make contact with each other. In the same manner, piece board 12 (in particular, plug-in portion (16a)) and frame 26 (in particular, plug-in portion (26a)) are also fitted to each other as shown in FIG. 26. As a result, due to friction force at the connected portion, piece board 12 is fixed to space (R20) formed in second board 20 in step (S23) of FIG. 15 (see FIG. 24), and multi-piece board (100a) is formed as shown in FIG. 26. In the present embodiment, when edge surface (F14) of conductive pattern (121c) (FIG. 9) and edge surface (F26) of conductive pattern (232c) (FIG. 19) make contact with each other, relative positions of piece board 12 and second board 20 are determined.

Figure 26:
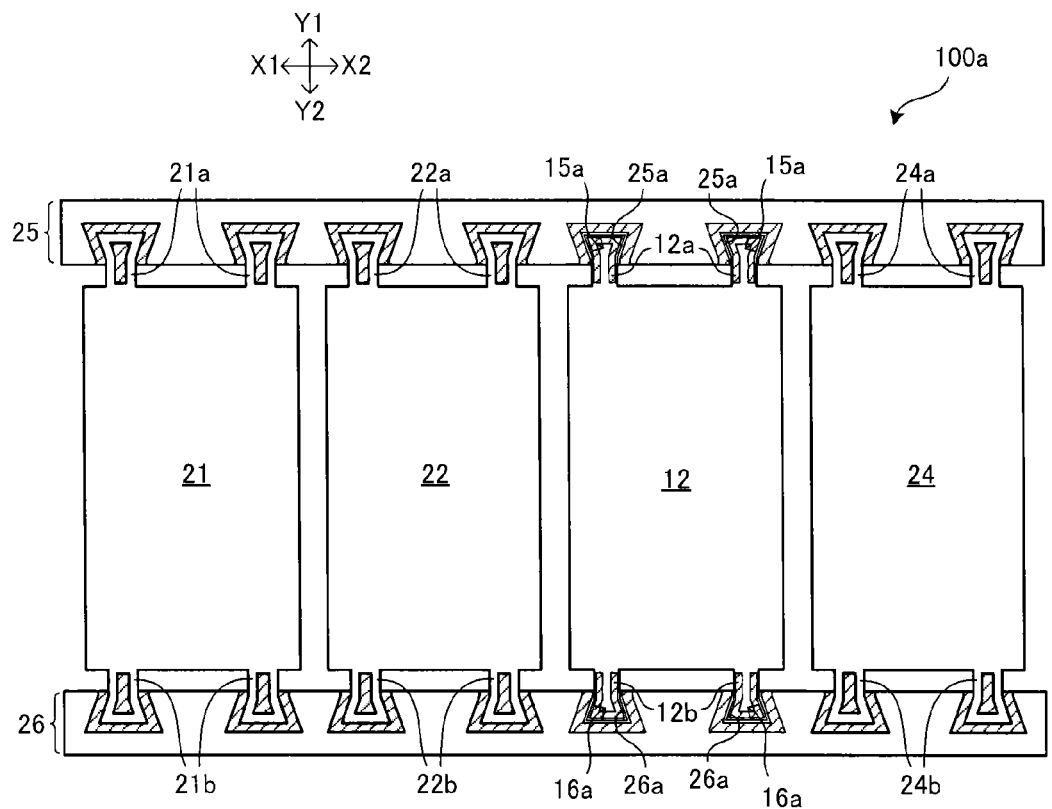
FIG. 26 is a view of the second board with a good piece fitted by the step shown in FIGS. 25A and 25B.

Space (R30) is formed as shown in FIG. 25B, for example, between plug-in portion (15a) of piece board 12 (see FIG. 26) and plug-in portion (25a) of frame 25 (see FIG. 26) and between plug-in portion (16a) of piece board 12 (see FIG. 26) and plug-in portion (26a) of frame 26 (see FIG. 26). As shown in FIG. 25B, space (R30) is formed between cut surface (F1) and cut surface (F2), and the width (width in direction Y) increases from the contact portion (in particular, boundary portions (P10, P20)) toward first main surface (F11) or third main surface (F21). Next, in step (S25) of FIG. 15, using a press machine, for example, multi-piece board (100a) (FIG. 26) is pressed to flatten surfaces of multi-piece board (100a) (especially the connected portions of piece board 12 and frames (25, 26)). Here, the method for making flat surfaces is not limited specifically, and roller press machines may also be used, for example.

Next, in step (S26) of FIG. 15, a laser displacement sensor, for example, is used to inspect the degree of flatness of multi-piece board (100a). The pressing in step (S25) is repeated until the degree of its flatness is determined to be good in step (S26).

Figure 27A:
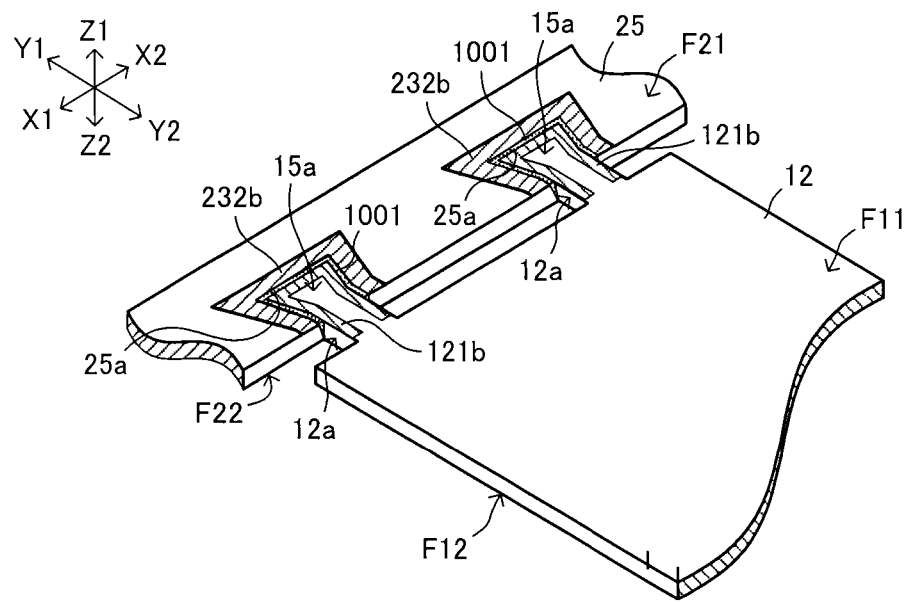
FIG. 27A, regarding the multi-piece board shown in FIG. 26, is a perspective view illustrating a step for forming an adhesive between a plug-in portion of a piece board and a plug-in portion of a frame.
Figure 27B:
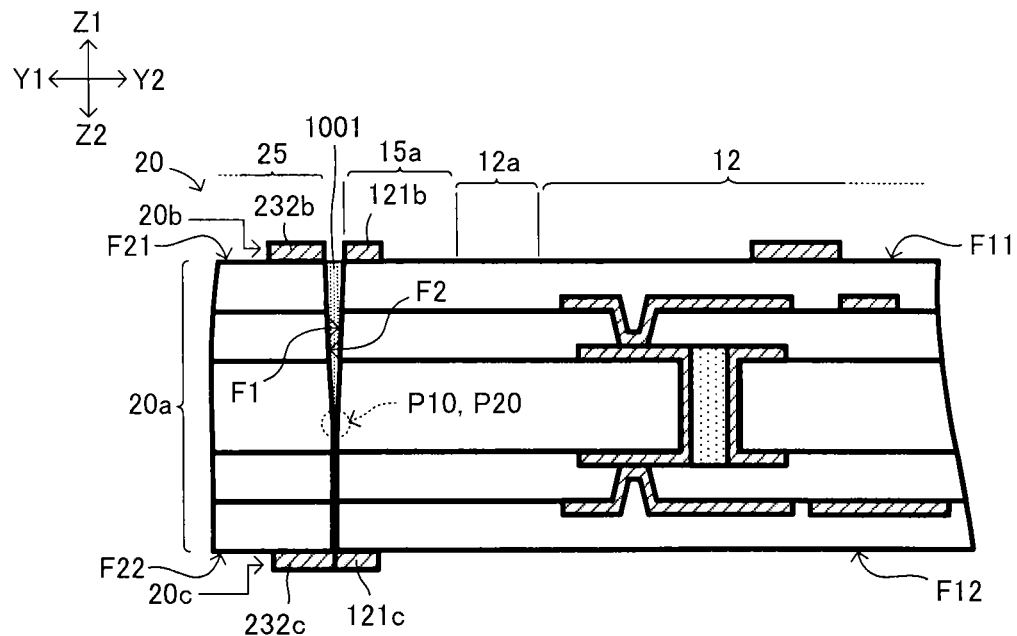
FIG. 27B, regarding the multi-piece board shown in FIG. 26, is a cross-sectional view illustrating a step for forming an adhesive between a plug-in portion of a piece board and a plug-in portion of a frame.

When the degree of flatness is determined to be good in step (S26), UV curable adhesive 1001 is applied in subsequent step (S27) of FIG. 15 between plug-in portion (15a) of piece board 12 (see FIG. 26) and plug-in portion (25a) of frame 25 (see FIG. 26) and between plug-in portion (16a) of piece board 12 (see FIG. 26) and plug-in portion (26a) of frame 26 (see FIG. 26) as shown in FIGS. 27A and 27B. Adhesive 1001 is filled in a gap between cut surface (F1) and cut surface (F2) as shown in FIG. 27B.

Next, in step (S28) of FIG. 15, UV rays are irradiated on adhesive 1001. Accordingly, applied adhesive 1001 is cured. As a result, frames (25, 26) and piece board 12 are firmly adhered. Here, adhesives are not limited to a UV curable type. For example, a thermosetting adhesive may also be used instead of a UV curable adhesive. Also, two or more types of adhesives may be used. For example, after using a photocurable adhesive or acrylic adhesive for adhesion (preliminary adhesion), a thermosetting adhesive may be used for reinforcement.

By the steps above, multi-piece board 100 of the present embodiment (see FIG. 1) is complete. Specifically, piece boards (21, 22, 24) respectively form piece boards (101, 102, 104), piece board 12 forms piece board 103, frames (25, 26) respectively form frames (105, 106), bridges (21a, 22a, 24a, 21b, 22b, 24b) respectively form bridges (101a, 102a, 104a, 101b, 102b, 104b), and bridges (12a, 12b) respectively form bridges (103a, 103b) (see FIGS. 1A and 26). In an integrated connection part shown in FIG. 2 (regions (R101) in FIGS. 1A and 1B) and in a fitted connection part shown in FIG. 3 (regions (R102) in FIGS. 1A and 1B), conductive patterns are formed differently from each other. Multi-piece board 100 of the present embodiment is manufactured by a plug-in board replacement method as shown in FIGS. 4 and 15.

Multi-piece board 100 of the present embodiment has piece boards (101~104) (multiple wiring boards) and frames (105, 106) connected to each of piece boards (101~104) as shown in FIGS. 1A and 26. Piece board 103 (first wiring board) is formed from piece board 12, and frames (105, 106) are respectively formed from frames (25, 26) (see FIGS. 1A and 1B). Piece board 12 (first wiring board) has plug-in portions (15a, 16a) (each a first plug-in portion), frame 25 has plug-in portion (25a) (second plug-in portion) to be fitted with plug-in portion (15a) of piece board 12, and frame 26 has plug-in portion (26a) (second plug-in portion) to be fitted with plug-in portion (16a) of piece board 12.

In plug-in portions (15a, 16a) of piece board 12, cut surface (F1) (first cut surface) is formed, connecting edge surface (F13) of conductive pattern (121b) and edge surface (F14) of conductive pattern (121c) (see FIGS. 9, 26 and 27B). Also, in plug-in portions (25a, 26a) of frames (25, 26), cut surface (F2) (second cut surface) is formed, connecting edge surface (F25) of conductive pattern (232b) and edge surface (F26) of conductive pattern (232c) (see FIGS. 19, 26 and 27B).

Cut surface (F1) has a portion protruding from edge surface (F13) of conductive pattern (121b), but has no portion protruding from edge surface (F14) of conductive pattern (121c) (see FIG. 13). Also, cut surface (F2) has a portion protruding from edge surface (F25) of conductive pattern (232b), but has no portion protruding from edge surface (F26) of conductive pattern (232c) (see FIG. 23). In addition, plug-in portion (15a) of piece board 12 and plug-in portion (25a) of frame 25, as well as plug-in portion (16a) of piece board 12 and plug-in portion (26a) of frame 26, are fitted with each other respectively while edge surface (F14) of conductive pattern (121c) (FIG. 9) and edge surface (F26) of conductive pattern (232c) (FIG. 19) are in contact with each other (see FIGS. 26 and 27B).

Edge surface (F13) of conductive pattern (121b) and edge surface (F14) of conductive pattern (121c) are formed continuously along their respective peripheries of plug-in portions (15a, 16a) of piece board 12, and edge surface (F25) of conductive pattern (232b) and edge surface (F26) of conductive pattern (232c) are formed continuously along their respective peripheries of plug-in portions (25a, 26a) (see FIGS. 9, 19, 26 and 27B). Edge surface (F14) of conductive pattern (121c) and edge surface (F26) of conductive pattern (232c) are in contact entirely along their respective peripheries of both plug-in portions. However, that is not the only option, and edge surface (F13) of conductive pattern (121b) and edge surface (F14) of conductive pattern (121c) may be formed intermittently along their respective peripheries of plug-in portions (15a, 16a) of piece board 12, and edge surface (F25) of conductive pattern (232b) and edge surface (F26) of conductive pattern (232c) may be formed intermittently along their respective peripheries of plug-in portions (25a, 26a). Moreover, in such cases, it is an option to form holes or grooves (such as non-penetrating holes or grooves) using a drill or a laser to fill an adhesive in portions corresponding to gaps (intermittent portions) in conductive patterns (121b, 121c, 232b, 232c) at boundaries of plug-in portion (15a) or (16a) and plug-in portion (25a) or (26a).

In the method for manufacturing a multi-piece board (or the plug-in board replacement method) according to the present embodiment, substrate (10a) (first board 10) having first main surface (F11) and its opposing second main surface (F12) is prepared, and a laser is irradiated on substrate (10a) so that part of substrate (10a) is cut out as a piece board (piece board 12) (steps (S11, S13) of FIG. 4). In addition, prior to the above laser irradiation, conductive patterns (121b, 122b) (first conductive patterns) with slit (123b) (first slit) are formed on first main surface (F11) of substrate (10a), and conductive patterns (121c, 122c) (second conductive patterns) with slit (123c) (second slit) are formed on second main surface (F12) of substrate (10a). Then, during the above laser irradiation, substrate (10a) is processed by irradiating a laser beam on slit (123b) from the first main-surface (F11) side, and substrate (10a) is processed by irradiating a laser beam on slit (123c) from the second main-surface (F12) side so that substrate (10a) is cut from first main surface (F11) through second main surface (F12) (step (S13) of FIG. 4). In such a method, since laser processing is performed using conductive patterns (121b, 122b, 121c, 122c) as masks, processing errors while cutting out a piece board (piece board 12) are reduced.

Also, when cutting second board 20 in the present embodiment, since laser processing is performed using conductive patterns (231b, 232b, 231c, 232c) as masks (or stoppers), processing errors while forming a space in second board 20 are reduced (see FIGS. 20A~22).

In the method for manufacturing a multi-piece board (or the plug-in board replacement method) according to the present embodiment, first board 10 and second board 20 are cut by irradiating a laser on both of their respective surfaces. Thus, when a piece board cut out from first board 10 (piece board 12) is fitted into another board (second board 20), their alignment accuracy is enhanced. In the following, reasons for that are further described with reference to FIGS. 28A~29.

Figure 28A:
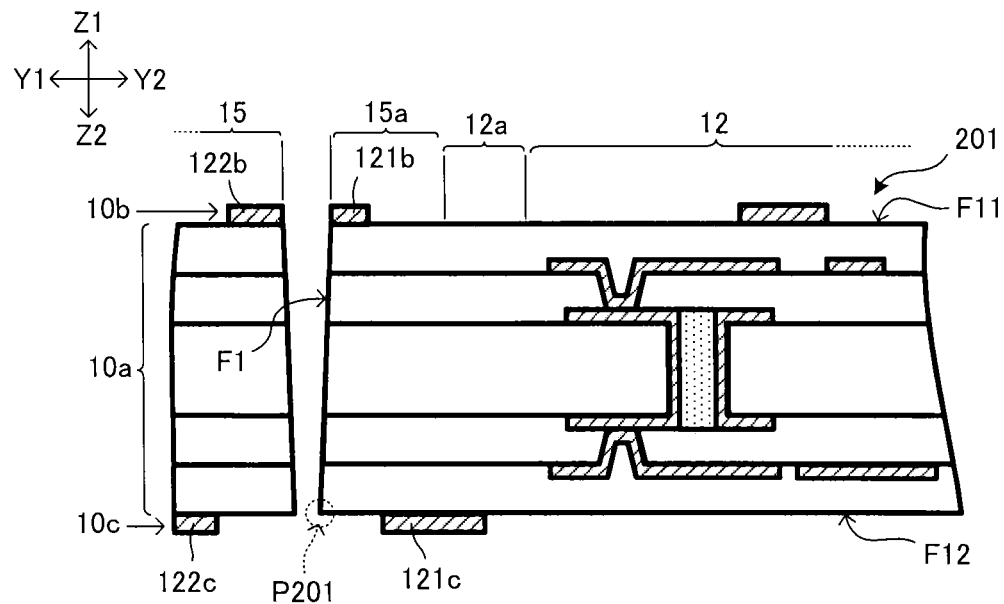
FIG. 28A is a view showing a first board to be used in a method according to a comparative example.
Figure 28B:
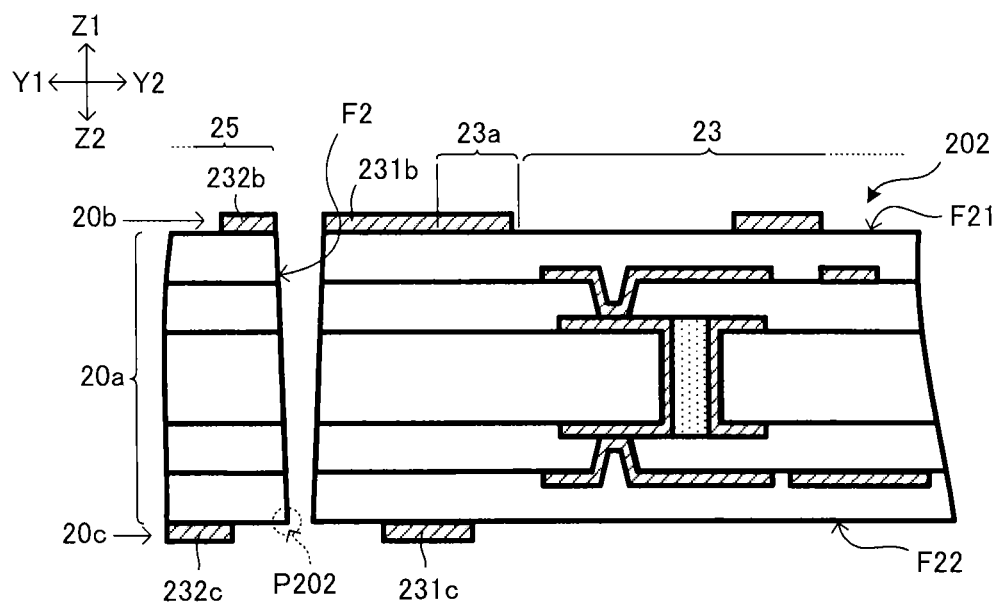
FIG. 28B is a view showing a second board to be used in the method according to a comparative example.

The following is a study of another method for manufacturing a multi-piece board (or a plug-in board replacement method). In such a method, using first board 201 as shown in FIG. 28A, and second board 202 as shown in FIG. 28B, for example, first board 201 and second board 202 are cut by irradiating a laser on only one surface of each board. Hereinafter such a method is referred to as a method according to a comparative example to differentiate it from the method according to the above embodiment.

In first board 201 shown in FIG. 28A, conductive patterns (121b, 122b) are formed on portions of first main surface (F11) of substrate (10a) on which a laser beam is irradiated, but there is no conductive pattern formed on its opposing second main surface (F12) (or conductive patterns are positioned farther from laser processing portions). In second board 202 shown in FIG. 28B, conductive patterns (231b, 232b) are formed in portions of third main surface (F21) of substrate (20a) on which a laser beam is irradiated, but there is no conductive pattern formed on its opposing fourth main surface (F22) (or conductive patterns are positioned farther from laser processing portions).

For example, piece board 12 is cut out from first board 201 as shown in FIG. 28A, and a space is formed in second board 202 by cutting out part of second board 202 as shown in FIG. 28B. When insulation layers (especially, resin) are processed by a laser, their processed amounts tend to decrease as the laser processing progresses (goes deeper). Thus, cut surface (F1) of substrate (10a) protrudes outward from the edge surface of conductive pattern (121b) as shown in FIG. 28A. It is thought that cut substrate (10a) protrudes the most at second main surface (F12) from the edge surface of conductive pattern (121b). In addition, cut surface (F2) of substrate (20a) protrudes outward from the edge surface of conductive pattern (232b). It is thought that cut substrate (20a) protrudes the most at fourth main surface (F22) from the edge surface of conductive pattern (232b).

Figure 29:
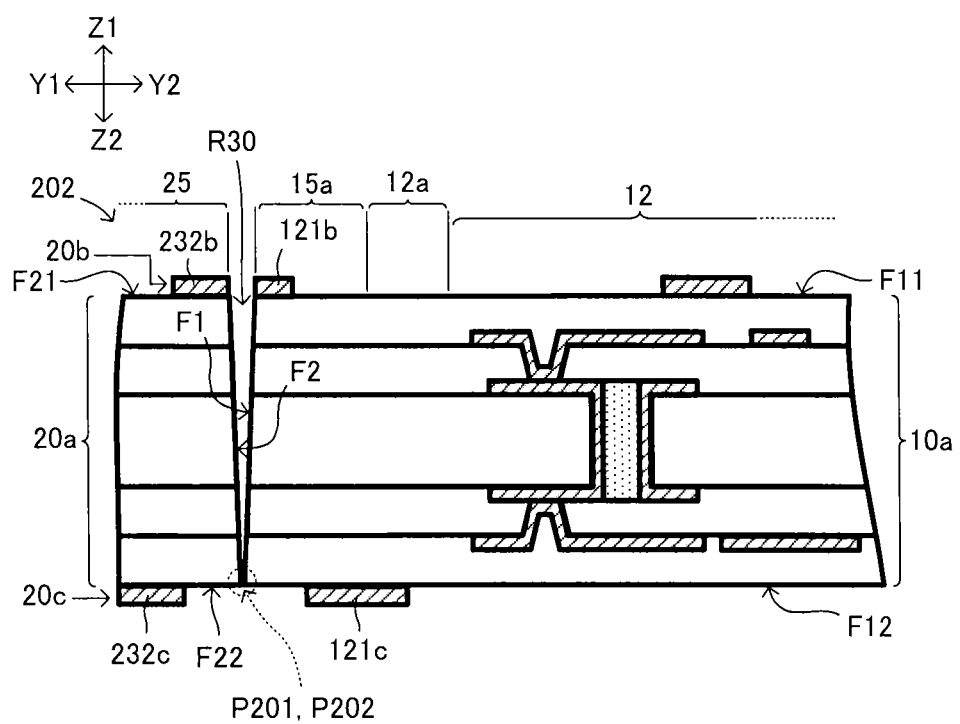
FIG. 29, in the method according to a comparative example, is a view showing a state where a piece board that is cut out from the first board shown in FIG. 28A is fitted into a space of the second board shown in FIG. 28B.

When piece board 12 cut out from first board 201 shown in FIG. 28A is fitted into the space of second board 202 shown in FIG. 28B, it is thought that they are fixed to each other while protruding portion (P201) of substrate (10a) (at second main surface (F12), for example) and protruding portion (P202) of substrate (20a) (at fourth main surface (F22), for example), which protrude the most, make contact with each other, as shown in FIGS. 28A, 28B and 29. In such a case, relative positions of piece board 12 and second board 202 are thought to be determined by the position of cut surface (F1) on second main surface (F12) (where cut surface (F1) and second main surface (F12) intersect) and the position of cut surface (F2) on fourth main surface (F22) (where cut surface (F2) and fourth main surface (F22) intersect). However, in the method according to a comparative example, protruding portion (P201) shown in FIG. 28A (for example, cut surface (F1) on second main surface (F12)) protrudes significantly from the edge surface of conductive pattern (121b), and protruding portion (P202) shown in FIG. 28B (for example, cut surface (F2) on fourth main surface (F22)) protrudes significantly from the edge surface of conductive pattern (232b). Thus, space (R30) is enlarged as shown in FIG. 29, making it difficult to align piece board 12 and second board 202 with a high degree of accuracy.

By contrast, in the method for manufacturing a multi-piece board (or the plug-in board replacement method) according to the present embodiment, using first board 10 shown in FIG. 8 and second board 20 shown in FIG. 18, a laser is irradiated on both of their respective surfaces to cut first board 10 and second board 20.

In first board 10 shown in FIG. 8, conductive patterns (121b, 122b) with slit (123b) are formed on first main surface (F11) of substrate (10a), and conductive patterns (121c, 122c) with slit (123c) are formed on opposing second main surface (F12).

In second board 20 shown in FIG. 18, conductive patterns (231b, 232b) with slit (233b) are formed on third main surface (F21) of substrate (20a), and conductive patterns (231c, 232c) with slit (233c) are formed on opposing fourth main surface (F22).

When cutting substrate (10a), substrate (10a) is processed by irradiating a laser beam on slit (123b) from the first main-surface (F11) side, and substrate (10a) is processed by irradiating a laser beam on slit (123c) from the second main-surface (F12) side as shown in FIGS. 10A~12. Also, when cutting substrate (20a), substrate (20a) is processed by irradiating a laser beam on slit (233b) from the third main-surface (F21) side, and substrate (20a) is processed by irradiating a laser beam on slit (233c) from the fourth main-surface (F22) side as shown in FIGS. 20A~22. In such a method, since substrate (10a) is cut by processing substrate (10a) through laser irradiation from both the first main-surface (F11) side and the second main-surface (F12) side, amount of protrusion (D16) at boundary portion (P10) (FIG. 13) is reduced. In addition, since substrate (20a) is cut by processing substrate (20a) through laser irradiation from both the third main-surface (F21) side and the fourth main-surface (F22) side, amount of protrusion (D26) at boundary portion (P20) (FIG. 23) is reduced. Accordingly, by reducing amount of protrusion (D16) at boundary portion (P10) (FIG. 13) and amount of protrusion (D26) at boundary portion (P20) (FIG. 23), space (R30) (FIG. 25B) is made smaller. When space (R30) (FIG. 25B) between piece board 12 and second board 20 is reduced, it is easier to reduce alignment errors between them. Therefore, using the method for manufacturing a multi-piece board (or the plug-in board replacement method) according to the present embodiment, when a piece board cut out from first board 10 (piece board 12) is fitted into another board (second board 20), their alignment accuracy is enhanced.

In addition, slit (123b) (first slit) has a greater width than the width of slit (123c) (second slit) in the present embodiment, and after recess (10d) (FIG. 11) is formed in substrate (10a) by a first laser irradiation, the portion facing recess (10d) (FIG. 11) is processed by a second laser irradiation so that substrate (10a) is cut from first main surface (F11) through second main surface (F12). Since slit (123b) is greater, it is easier to form recess (10d) (FIG. 11) deeper by the first laser irradiation. Here, the same applies to processing substrate (20a) (slit (233b), slit (233c), third laser irradiation, fourth laser irradiation and recess (20d)).

Also, in the present embodiment, depth (D18) of boundary portion (P10) is greater than depth (D19) of boundary portion (P10) (see FIG. 13). Accordingly, it is easier to set surface (F102) and edge surface (F14) to be flush (surface (F102) does not protrude). In addition, depth (D28) of boundary portion (P20) is greater than depth (D29) of boundary portion (P20) (see FIG. 23). Accordingly, it is easier to set surface (F202) and edge surface (F26) to be flush (surface (F202) does not protrude).

In addition, if amount of protrusion (D15) at edge surface (F14) (FIG. 9) is 40 μm or greater, it is especially easier to set surface (F102) and edge surface (F14) to be flush, and if amount of protrusion (D25) at edge surface (F26) (FIG. 19) is 40 μm or greater, it is especially easier to set surface (F202) and edge surface (F26) to be flush.

In the present embodiment, since cut surface (F1) does not include any portion that protrudes from edge surface (F14) of conductive pattern (121c), edge surface (F14) of conductive pattern (121c) is easily fitted into second board 20 while they are in contact. Accordingly, it is easier to enhance their alignment accuracy.

Moreover, cut surface (F2) does not include any portion that protrudes from edge surface (F26) of conductive pattern (232c) in the present embodiment. Accordingly, plug-in portion (15a) of piece board 12 (FIG. 26) and plug-in portion (25a) of frame 25 (FIG. 26) as well as plug-in portion (16a) of piece board 12 (FIG. 26) and plug-in portion (26a) of frame 26 (FIG. 26) are easily fitted to each other, while edge surface (F14) of conductive pattern (121c) (FIG. 9) and edge surface (F26) of conductive pattern (232c) (FIG. 19) make contact with each other. Therefore, it is easier to enhance their alignment accuracy.

In the present embodiment, when piece board 12 cut out from first board 10 shown in FIG. 14 is fitted into space (R20) of second board 20 shown in FIG. 24, edge surface (F14) of conductive pattern (121c) (see FIG. 9) and edge surface (F26) of conductive pattern (232c) (see FIG. 19) make contact with each other (see FIG. 25B). Namely, when piece board 12 and second board 20 are aligned, edge surfaces of conductive patterns which are in contact with each other work as the alignment base. Since conductive patterns (especially metal) are hard to be processed by a laser, base positions tend to be maintained after laser processing.

Compared with processing errors when substrate (10a) or substrate (20a) is cut without forming conductive patterns, the degree (errors) of shifting from the desired position is thought to be small for edge surface (F14) or (F26) when conductive pattern (121c) or (232c) is formed. Thus, alignment accuracy is thought to be enhanced when fitting a piece board cut out from first board 10 (piece board 12) and another board (second board) to each other according to the method for manufacturing a multi-piece board (or the plug-in board replacement method) of the present embodiment.

So far, an embodiment of the present invention is described. However, the present invention is not limited to the above embodiment.

A first laser irradiation and a second laser irradiation may be conducted at the same time. Also, procedures for conducting a first laser irradiation and a second laser irradiation may each be divided. For example, after a first recess is formed by a first laser irradiation, a recess is formed opposite the first recess by a second laser irradiation, and another first laser irradiation is further conducted to connect the bottom of the first recess and the bottom of the recess. The same applies to a third laser irradiation and a fourth laser irradiation.

Width (D11) of slit (123b) (FIG. 9) and width (D12) of slit (123e) (FIG. 9) may be the same as each other. Also, width (D21) of slit (233b) and width (D22) of slit (233c) may be the same as each other.

It is an option for the position of edge surface (F13) of conductive pattern (121b) (Y coordinate in FIG. 9) to correspond to the position of edge surface (F14) of conductive pattern (121c) (Y coordinate in FIG. 9). The same applies to edge surface (F15) of conductive pattern (122b) and edge surface (F16) of conductive pattern (122c), edge surface (F23) of conductive pattern (231b) and edge surface (F24) of conductive pattern (231c), and edge surface (F25) of conductive pattern (232b) and edge surface (F26) of conductive pattern (232c).

In the above embodiment, plug-in portions (15a, 16a) of piece board 12 are each set as a convex portion, and plug-in portion (25a) of frame 25 and plug-in portion (26a) of frame 26 are each set as a concave portion. However, that is not the only option, and at least one of plug-in portions (15a, 16a) of piece board 12 may be set as a concave portion, and at least its corresponding plug-in portion (25a) of frame 25 or plug-in portion (26a) of frame 26 may be set as a convex portion.

Conductive patterns (122b, 122c) in the above embodiment (see FIGS. 7A, 7B and 10B) may be omitted. In such a case as well, by using conductive patterns (121b, 121c) as masks, cut surface (F1) is formed in substrate (10a) connecting edge surface (F13) of conductive pattern (121b) (see FIG. 9) and edge surface (F14) of conductive pattern (121c) (see FIG. 9).

Conductive patterns (231b, 231c) in the above embodiment (see FIGS. 17A, 17B and 20B) may be omitted. In such a case as well, by using conductive patterns (232b, 232c) as masks, cut surface (F2) is formed in substrate (20a), connecting edge surface (F25) of conductive pattern (232b) (see FIG. 19) and edge surface (F26) of conductive pattern (232c) (see FIG. 19).

The structure of a wiring board (piece board), especially the type, quality, measurements, material, shape, number of layers, positioning or the like of its elements may be modified freely within a scope that does not deviate from the gist of the present invention.

The method for manufacturing a multi-piece board (or a plug-in board replacement method) according to an embodiment of the present invention is not limited to the order shown in FIG. 4 or FIG. 15. The order may be modified freely within a scope that does not deviate from the gist of the present invention. In addition, some step may be omitted depending on desired usage or the like.

If desired bonding strength is secured when a piece board (piece board 12) is fitted into second board 20 (especially frames (25, 26)), the adhesion process using an adhesive (steps (S27, S28) in FIG. 15) may be omitted. In the above embodiment, since surface (F102) (FIG. 13) and surface (F202) (FIG. 23) make contact with each other, their bonding area increases. Thus, it is easier to achieve sufficient bonding strength.

It is not always required to set surface (F102) and edge surface (F14) to be flush, or to set surface (F202) and edge surface (F26) to be flush.

The above plug-in board replacement method may be used rather than manufacturing a multi-piece board. For example, a piece board cut out from first board 10 (piece board 12, for example) may be attached to a frame where no piece board is connected.

Figure 30:
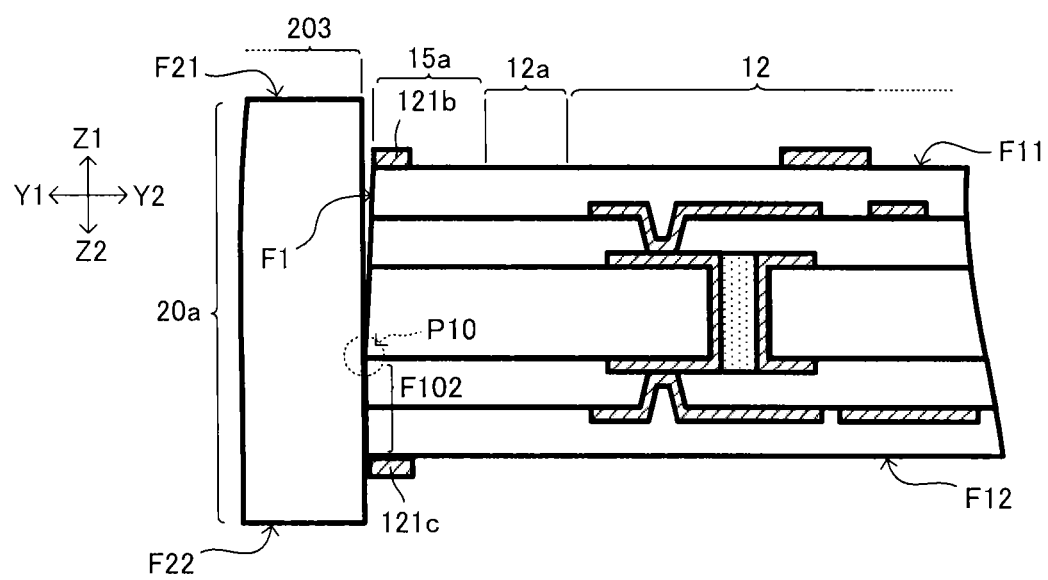
FIG. 30, in a method for manufacturing a multi-piece board (plug-in board replacement method) according to another embodiment of the present invention, is a view showing an example where a piece board that is cut out from a board is fitted into another board thicker than the piece board.

As shown in FIG. 30, a piece board (piece board 12) cut out from a board (first board 10) may be fitted into another board (frame 203) thicker than the piece board (piece board 12). In the example shown in FIG. 30, an edge surface of conductive pattern (121c) and surface (F102) make contact with board (20a) of frame 203 (resin). In such a case as well, alignment accuracy of the piece board (piece board 12) and frame 203 is enhanced.

A plug-in board replacement method according to a first aspect of the present invention includes the following: preparing a board having a first main surface and an opposing second main surface; forming a first conductive pattern on the first main surface of the board; forming a second conductive pattern on the second main surface opposite the first conductive pattern of the board; cutting out part of the board as a piece board by irradiating a laser on the board; and fitting the cut-out piece board into another board. In such a method, the laser irradiation includes a first laser irradiation for processing the board by irradiating a laser beam from the first main-surface side on both the first conductive pattern and the board which have a border between them at an edge surface of the first conductive pattern, and a second laser irradiation for processing the board by irradiating a laser beam from the second main-surface side on both the second conductive pattern and the board which have a border between them at an edge surface of the second conductive pattern, and the board is cut from the first main surface through the second main surface by the first laser irradiation and the second laser irradiation.

A method for manufacturing a multi-piece board according to a second aspect of the present invention is for manufacturing a multi-piece board having multiple wiring boards and a frame connected to each of the multiple wiring boards by the plug-in board replacement method according to the first aspect of the present invention. The other board forms the frame, and the piece board forms one of the multiple wiring boards in such a method for a plug-in board replacement according to the first aspect of the present invention.

A multi-piece board according to a third aspect of the present invention has multiple wiring boards and a frame connected to each of the multiple wiring boards. A first wiring board, which is one of the multiple wiring boards, has a first plug-in portion, and the frame has a second plug-in portion to be fitted to the first plug-in portion; the first plug-in portion of the first wiring board has a first main surface, an opposing second main surface, a first conductive pattern on the first main surface, and on the second main surface of the first plug-in portion opposite the first conductive pattern, a second conductive pattern having an end surface positioned away from an end surface of the first conductive pattern; a cut surface connecting the end surface of the first conductive pattern and the end surface of the second conductive pattern is formed in the first plug-in portion of the first wiring board; and the first plug-in portion of the first wiring board and the second plug-in portion of the frame are fitted together in such a way that the second plug-in portion of the frame makes contact with the end surface of the second conductive pattern.

Obviously, numerous modifications and variations of the present invention are possible in light of the above teachings. It is therefore to be understood that within the scope of the appended claims, the invention may be practiced otherwise than as specifically described herein.

What is claimed is:

1. A plug-in board replacement method, comprising:
   preparing a board having a piece board;
   forming a first conductive pattern on a first surface of the board;
   forming a second conductive pattern on a second surface on an opposite side of the board with respect to the first surface such that the second conductive pattern is positioned on the opposite side of the board with respect to the first conductive pattern of the board;
   irradiating laser upon the first surface and second surface of the board along the first conductive pattern and the second conductive pattern such that the piece board is cut out from the board; and
   fitting the piece board cut out from the board into another board,
   wherein the irradiating of laser includes a first laser irradiation comprising irradiating laser upon the first surface of the board along the first conductive pattern such that the laser is irradiated along a border between an edge portion of the first conductive pattern and the first surface of the board and a second laser irradiation comprising irradiating laser upon the second surface of the board along the second conductive pattern such that the laser is irradiated along a border between an edge portion of the second conductive pattern and the second surface of the board such that the piece board is cut out through the board.

2. The plug-in board replacement method according to claim 1, wherein the second conductive pattern is formed on the second surface of the board such that the edge portion of the second conductive pattern is positioned away from the edge portion of the first conductive pattern, the first laser irradiation forms a recess in the board, and the second laser irradiation processes a portion of the second surface of the board facing the recess such that the piece board is cut out through the board.

3. The plug-in board replacement method according to claim 1, wherein the first laser irradiation and the second laser irradiation form a first cut surface connecting the edge portion of the first conductive pattern and the edge portion of the second conductive pattern such that the first cut surface has a portion protruding from the edge portion of the first conductive pattern and does not protrude from the edge portion of the second conductive pattern, and the fitting of the piece board includes fitting the piece board with the other board such that the edge portion of the second conductive pattern makes contact with the other board.

4. The plug-in board replacement method according to claim 1, further comprising forming a space in the other board, wherein the fitting of the piece board comprises fixing the piece board in the space formed in the other board.

5. The plug-in board replacement method according to claim 4, wherein the forming of the space includes forming a third conductive pattern on a surface of the other board, forming a fourth conductive pattern on an opposite surface of the other board on an opposite side with respect to the third conductive pattern on the other board, and irradiating laser upon the other board along the third conductive pattern and fourth conductive pattern formed on the other board such that a portion of the other board corresponding to the space is cut out from the other board, the irradiating of the other board includes a third laser irradiation comprising irradiating laser upon the surface of the other board along the third conductive pattern such that the laser is irradiated along a border between an edge portion of the third conductive pattern and the surface of the other board and a fourth laser irradiation comprising irradiating laser upon the opposite surface of the other board along the fourth conductive pattern such that the laser is irradiated along a border between an edge portion of the fourth conductive pattern and the opposite surface of the other board such that the portion corresponding to the space in the other board is cut out through the other board.

6. The plug-in board replacement method according to claim 5, wherein the third laser irradiation and the fourth laser irradiation form a second cut surface connecting the edge portion of the third conductive pattern and the edge portion of the fourth conductive pattern such that the second cut surface has a portion protruding from the edge portion of the third conductive pattern and does not protrude from the edge portion of the fourth conductive pattern, and the fitting of the piece board includes fitting the piece board with the other board such that the edge portion of the fourth conductive pattern makes contact with the edge portion of the second conductive pattern.

7. The plug-in board replacement method according to claim 1, wherein each of the board and the other board is a multi-piece board having a plurality of wiring boards and a frame connected to the plurality of wiring boards.

8. A method for manufacturing a multi-piece board, comprising:
   preparing a board having a piece wiring board;
   forming a first conductive pattern on a first surface of the board;
   forming a second conductive pattern on a second surface on an opposite side of the board with respect to the first surface such that the second conductive pattern is positioned on the opposite side of the board with respect to the first conductive pattern of the board;
   irradiating laser upon the first surface and second surface of the board along the first conductive pattern and the second conductive pattern such that the piece wiring board is cut out from the board; and fitting the piece wiring board cut out from the board into a frame, wherein the irradiating of laser includes a first laser irradiation comprising irradiating laser upon the first surface of the board along the first conductive pattern such that the laser is irradiated along a border between an edge portion of the first conductive pattern and the first surface of the board and a second laser irradiation comprising irradiating laser upon the second surface of the board along the second conductive pattern such that the laser is irradiated along a border between an edge portion of the second conductive pattern and the second surface of the board such that the piece wiring board is cut out through the board.

9. The method for manufacturing a multi-piece board according to claim 8, wherein the second conductive pattern is formed on the second surface of the board such that the edge portion of the second conductive pattern is positioned away from the edge portion of the first conductive pattern, the first laser irradiation forms a recess in the board, and the second laser irradiation processes a portion of the second surface of the board facing the recess such that the piece wiring board is cut out through the board.

10. The method for manufacturing a multi-piece board according to claim 8, wherein the first laser irradiation and the second laser irradiation form a first cut surface connecting the edge portion of the first conductive pattern and the edge portion of the second conductive pattern such that the first cut surface has a portion protruding from the edge portion of the first conductive pattern and does not protrude from the edge portion of the second conductive pattern, and the fitting of the piece wiring board includes fitting the piece wiring board with the frame such that the edge portion of the second conductive pattern makes contact with the other board.

11. The method for manufacturing a multi-piece board according to claim 8, further comprising forming a space in the frame, wherein the fitting of the piece wiring board comprises fixing the piece wiring board in the space formed in the frame.

12. The method for manufacturing a multi-piece board according to claim 11, wherein the forming of the space includes forming a third conductive pattern on a surface of the frame, forming a fourth conductive pattern on an opposite surface of the frame on an opposite side with respect to the third conductive pattern on the frame, and irradiating laser upon the frame along the third conductive pattern and fourth conductive pattern formed on the frame such that a portion of the frame corresponding to the space is cut out from the frame, the irradiating of the frame includes a third laser irradiation comprising irradiating laser upon the surface of the frame along the third conductive pattern such that the laser is irradiated along a border between an edge portion of the third conductive pattern and the surface of the frame and a fourth laser irradiation comprising irradiating laser upon the opposite surface of the frame along the fourth conductive pattern such that the laser is irradiated along a border between an edge portion of the fourth conductive pattern and the opposite surface of the frame such that the portion corresponding to the space in the frame is cut out through the frame.

13. The method for manufacturing a multi-piece board according to claim 12, wherein the third laser irradiation and the fourth laser irradiation form a second cut surface connecting the edge portion of the third conductive pattern and the edge portion of the fourth conductive pattern such that the second cut surface has a portion protruding from the edge portion of the third conductive pattern and does not protrude from the edge portion of the fourth conductive pattern, and the fitting of the wiring board piece includes fitting the piece wiring board with the frame such that the edge portion of the fourth conductive pattern makes contact with the edge portion of the second conductive pattern.

14. The method for manufacturing a multi-piece board according to claim 8, wherein each of the board and the frame is a multi-piece board having a plurality of piece wiring boards and a frame connected to the plurality of piece wiring boards.

\* \* \* \* \*